United States Patent
Chae et al.

(10) Patent No.: US 9,536,924 B2
(45) Date of Patent: Jan. 3, 2017

(54) LIGHT-EMITTING DIODE AND APPLICATION THEREFOR

(71) Applicant: Seoul Viosys Co., Ltd., Ansan-si (KR)

(72) Inventors: Jong Hyeon Chae, Ansan-si (KR); Joon Sup Lee, Ansan-si (KR); Won Young Roh, Ansan-si (KR); Min Woo Kang, Ansan-si (KR); Jong Min Jang, Ansan-si (KR); Hyun A Kim, Ansan-si (KR); Daewoong Suh, Ansan-si (KR)

(73) Assignee: SEOUL VIOSYS CO., LTD., Ansan-Si (KR)

( * ) Notice: Subject to any disclaimer, the term of this patent is extended or adjusted under 35 U.S.C. 154(b) by 0 days.

(21) Appl. No.: 14/745,271

(22) Filed: Jun. 19, 2015

(65) Prior Publication Data
US 2015/0287762 A1    Oct. 8, 2015

Related U.S. Application Data

(63) Continuation-in-part of application No. 14/733,787, filed on Jun. 8, 2015, which is a continuation-in-part of
(Continued)

(30) Foreign Application Priority Data

Dec. 6, 2012   (KR) .................. 10-2012-0140991
Dec. 28, 2012  (KR) .................. 10-2012-0155783
Jan. 31, 2013  (KR) .................. 10-2013-0011453

(51) Int. Cl.
*H01L 27/15*   (2006.01)
*H01L 33/14*   (2010.01)
(Continued)

(52) U.S. Cl.
CPC ............ *H01L 27/153* (2013.01); *H01L 24/24* (2013.01); *H01L 25/0753* (2013.01);
(Continued)

(58) Field of Classification Search
CPC .......... H01L 33/00; H01L 33/58; H01L 33/36; H01L 33/60
(Continued)

(56) References Cited

U.S. PATENT DOCUMENTS 5,864,171 A    1/1999  Yamamoto et al.
2002/0093023 A1*  7/2002  Camras ................... H01L 33/02
                                                                257/94
(Continued)

FOREIGN PATENT DOCUMENTS

JP    2002026392 A    1/2002
JP    2006108161 A    4/2006
(Continued)

OTHER PUBLICATIONS

International Search Report, Korean Intellectual Property Office, International Application No. PCT/KR2013/009395, Jan. 28, 2014, 3 pages.

*Primary Examiner* — Cuong Q Nguyen
*Assistant Examiner* — Tong-Ho Kim
(74) *Attorney, Agent, or Firm* — Perkins Coie LLP

(57) ABSTRACT

A light-emitting diode is provided to include: a transparent substrate having a first surface, a second surface, and a side surface; a first conductive semiconductor layer positioned on the first surface of the transparent substrate; a second conductive semiconductor layer positioned on the first conductive semiconductor layer; an active layer positioned between the first conductive semiconductor layer and the second conductive semiconductor layer; a first pad electrically connected to the first conductive semiconductor layer;
(Continued)

and a second pad electrically connected to the second conductive semiconductor layer, wherein the transparent substrate is configured to discharge light generated by the active layer through the second surface of the transparent substrate, and the light-emitting diode has a beam angle of at least 140 degrees or more. Accordingly, a light-emitting diode suitable for a backlight unit or a surface lighting apparatus can be provided.

20 Claims, 22 Drawing Sheets

Related U.S. Application Data application No. PCT/KR2013/009395, filed on Oct. 22, 2013.

(51) Int. Cl.
    *H01L 33/40*     (2010.01)
    *H01L 33/44*     (2010.01)
    *H01L 33/24*     (2010.01)
    *H01L 23/00*     (2006.01)
    *H01L 25/075*     (2006.01)
    *H01L 33/20*     (2010.01)
    *H01L 33/38*     (2010.01)
    *H01L 33/08*     (2010.01)

(52) U.S. Cl.
    CPC .............. *H01L 33/20* (2013.01); *H01L 33/38* (2013.01); *H01L 33/405* (2013.01); *H01L 33/44* (2013.01); *H01L 33/08* (2013.01); *H01L 2924/0002* (2013.01); *H01L 2924/12041* (2013.01)

(58) Field of Classification Search
    USPC .......................................... 257/88; 362/97.1
    See application file for complete search history.

(56) References Cited

U.S. PATENT DOCUMENTS

| | | |
|---|---|---|
| 2005/0179051 A1 | 8/2005 | Kondoh et al. |
| 2006/0001046 A1* | 1/2006 | Batres ..................... H01L 33/22 257/202 |
| 2006/0145174 A1 | 7/2006 | Lee et al. |
| 2009/0001869 A1 | 1/2009 | Tanimoto et al. |
| 2011/0249424 A1* | 10/2011 | Joo ......................... H01L 33/50 362/97.1 |
| 2012/0043575 A1 | 2/2012 | Kim et al. |
| 2012/0193648 A1* | 8/2012 | Donofrio ............... H01L 33/508 257/88 |
| 2012/0228655 A1* | 9/2012 | Lin ...................... H01L 33/0062 257/98 |
| 2012/0235204 A1 | 9/2012 | Hodota et al. |
| 2013/0020462 A1* | 1/2013 | Kim ......................... F21K 9/13 250/205 |
| 2013/0322081 A1 | 12/2013 | Pan et al. |

FOREIGN PATENT DOCUMENTS

| | | |
|---|---|---|
| KR | 1020070065093 A | 6/2007 |
| WO | 2010074288 A1 | 7/2010 |

* cited by examiner (a)

(b)

(a)

(b)

(a)

(b)

Figure 5(a)
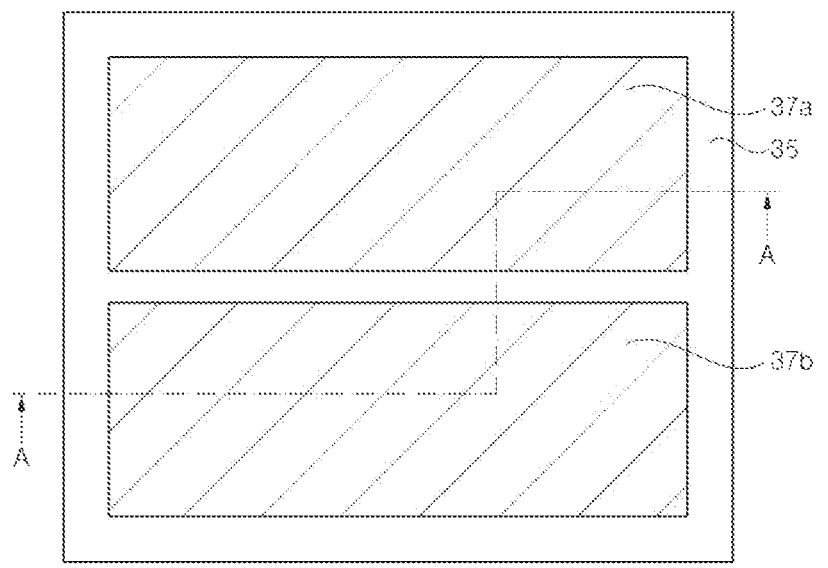
(a)
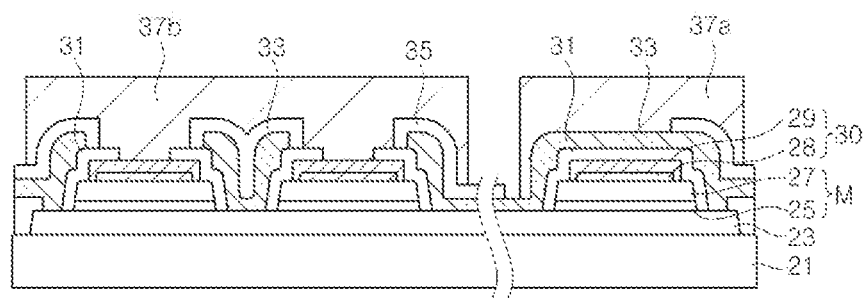
(b)
Figure 5(b)

(a)

(b)

(a)

(b)

(a)

(b)

LIGHT-EMITTING DIODE AND APPLICATION THEREFOR

PRIORITY CLAIMS AND CROSS-REFERENCES TO RELATED APPLICATIONS

This patent document is a continuation of, and claims priority and benefits of U.S. patent application Ser. No. 14/733,787, entitled "LIGHT-EMITTING DIODE AND APPLICATION THEREFOR" and filed on Jun. 8, 2015, which is a continuation-in-part of, and claims priority and the benefits of, a Patent Cooperation Treaty (PCT) application number PCT/KR2013/009395, entitled "LIGHT-EMITTING DIODE AND APPLICATION THEREFOR" and filed with the Korean Intellectual Property Office (KIPO) on Oct. 22, 2013, which further claims priorities and the benefits of Korean patent application number 10-2013-0011453 entitled "LIGHT-EMITTING DIODE AND APPLICATION THEREFOR" filed with KIPO on Jan. 31, 2013, Korean patent application number 10-2012-0155783 entitled "LIGHT-EMITTING DIODE AND APPLICATION THEREFOR" filed with KIPO on Dec. 28, 2012, and Korean patent application number 10-2012-0140991 entitled "LIGHT-EMITTING DIODE AND APPLICATION THEREFOR" filed with KIPO on Dec. 6, 2012. The contents of each application are incorporated by reference in their entirety.

TECHNICAL FIELD

This patent document relates to a light emitting diode and application thereof and, more particularly, to a flip-chip type light emitting diode having improved beam angle and application thereof.

BACKGROUND

Gallium nitride (GaN)-based light emitting diodes (LEDs) have been broadly used in a wide range of applications including full color LED displays, LED traffic signboards, backlight units, lighting devices, and the like.

Generally, a GaN-based light emitting diode is formed by growing epitaxial layers on a substrate such as a sapphire substrate, and includes an n-type semiconductor layer, a p-type semiconductor layer and an active layer interposed therebetween. On the other hand, an N-electrode pad is formed on the n-type semiconductor layer and a P-electrode pad is formed on the p-type semiconductor layer. The light emitting diode is electrically connected to an external power source through the electrode pads and operated thereby. Here, electric current flows from the P-electrode pad to the N-electrode pad through the semiconductor layers.

On the other hand, a flip-chip type light emitting diode is used to prevent light loss by the P-electrode pad while improving heat dissipation efficiency. The flip-chip type light emitting diode emits light through a growth substrate and thus can reduce light loss by the P-electrode pad, as compared with a vertical type light emitting diode that emits light through epitaxial layers thereof. Furthermore, a lateral type light emitting diode is configured to discharge heat through a growth substrate such as a sapphire substrate and thus has low heat dissipation efficiency. On the contrary, the flip-chip type light emitting diode discharges heat through the electrode pads and thus has high heat dissipation efficiency.

Furthermore, a vertical type light emitting diode is fabricated by removing the growth substrate such as a sapphire substrate from epitaxial layers in order to improve light extraction efficiency. Particularly, the vertical type light emitting diode can prevent light loss due to total internal reflection by texturing an exposed surface of the semiconductor layer.

On the other hand, in a specific application, particularly, in an application requiring irradiation of light over a wide area as in a backlight unit or a sheet-lighting apparatus, a beam angle of light is an important issue.

Generally, a conventional flip-chip type light emitting diode has a beam angle of about 120°, and a typical vertical type light emitting diode has a smaller beam angle than about 120° due to surface texturing. Accordingly, in the related art, a molding member or a separate secondary lens is used in order to increase a beam angle of light at a package level.

On the other hand, a lighting apparatus such as an LED fluorescent lamp may require an LED having different beam angles according to directions. When a plurality of LEDs is mounted inside a lighting apparatus of an elongated fluorescent lamp shape, it is advantageous that the LEDs have large beam angles in a direction orthogonal to a longitudinal direction of the fluorescent lamp.

SUMMARY

Some implementations of the disclosed technology provide a flip-chip type light emitting diode suitable for a backlight unit or a sheet-lighting apparatus, and application thereof.

Some implementations of the disclosed technology provide a flip-chip type light emitting diode that has improved light extraction efficiency through improvement in reflectivity.

Some implementations of the disclosed technology provide a flip-chip type light emitting diode that has improved current spreading performance.

Some implementations of the disclosed technology provide a light emitting diode that has different beam angles of light according to directions, and a lighting apparatus including the same.

Some implementations of the disclosed technology provide a flip-chip type light emitting diode having improved luminous efficacy, and a lighting apparatus including the same.

In one aspect, a light emitting diode is provided to include: a transparent substrate having a first surface, a second surface and a side surface connecting the first surface and the second surface; a first conductive type semiconductor layer placed over the first surface of the transparent substrate; a second conductive type semiconductor layer placed over the first conductive type semiconductor layer; an active layer placed between the first conductive type semiconductor layer and the second conductive type semiconductor layer; a first pad electrically connected to the first conductive type semiconductor layer; and a second pad electrically connected to the second conductive type semiconductor layer, wherein the transparent substrate is configured to discharge light generated in the active layer through the second surface of the transparent substrate. Further, the light emitting diode has a beam angle of 140° or more.

Unlike a typical light emitting diode, the light emitting diode according to embodiments of the disclosed technology has a relatively wide beam angle of 140° or more without using a lens-shaped molding member or a secondary lens. Thus, the light emitting diode according to the embodiments of the disclosed technology is suitable for a lighting apparatus including a sheet-lighting apparatus. The light emitting diode according to the embodiments of the disclosed technology may be directly used in various applications without a separate packaging process. Furthermore, the light emitting diode may be used without a secondary lens or may be used together with the secondary lens after being coupled thereto.

In some implementations, the light emitting diode may further include a conformal coating layer covering the second surface of the transparent substrate to enable the light emitted through the second surface to discharge through the conformal coating layer. The conformal coating layer may contain a phosphor and thus can convert a wavelength of at least part of light generated in the active layer.

In some implementations, a total thickness of the transparent substrate and the conformal coating layer may range from 225 μm to 600 μm. In some implementations, the transparent substrate may have a thickness of 150 μm to 400 μm. In some implementations, the conformal coating may have a thickness of 20 μm to 200 μm.

In some implementations, the transparent substrate may have a thickness of 225 μm to 400 μm. As the transparent substrate has a thickness of 225 μm to 400 μm, it is possible to provide a flip-chip type light emitting diode having a beam angle of 140° or more regardless of the presence of the conformal coating layer. If the thickness of the transparent substrate exceeds 400 μm, it is difficult to divide the substrate into individual light emitting diode chips.

In some implementations, the active layer and the second conductive type semiconductor layer are patterned to form a plurality of mesas that are separated from one another over the first conductive type semiconductor layer.

In some implementations, the light emitting diode may further include: reflective electrodes respectively placed over the plurality of mesas and forming ohmic contacts with the second conductive type semiconductor layer; and a current spreading layer placed over the plurality of mesas and the first conductive type semiconductor layer to form openings in upper regions of the plurality of mesas while exposing the reflective electrodes, the current spreading layer forming ohmic contacts with the first conductive type semiconductor layer and being insulated from the plurality of mesas, wherein the first pad may be electrically connected to the current spreading layer and the second pad may be electrically connected to the reflective electrodes through the openings.

Since the current spreading layer covers the plurality of mesas and the first conductive type semiconductor layer, the light emitting diode has improved current spreading performance through the current spreading layer.

In some implementations, the first conductive type semiconductor layer may be continuous. In some implementations, the plurality of mesas may have an elongated shape extending in one direction and may be disposed parallel to each other. In some implementations, the openings of the current spreading layer may be placed to be biased towards the same ends of the plurality of mesas. Thus, a pad connecting the reflective electrodes exposed through the openings of the current spreading layer to each other can be easily formed.

In some implementations, the current spreading layer may include a reflective metal such as Al. With this structure, it is possible to provide light reflection by the current spreading layer in addition to light reflection by the reflective electrodes, whereby light traveling through sidewalls of the plurality of mesas and the first conductive type semiconductor layer can be reflected thereby.

In some implementations, each of the reflective electrodes may include a reflective metal layer and a barrier metal layer, the barrier metal layer may cover an upper surface and a side surface of the reflective metal layer. With this structure, it is possible to prevent deterioration of the reflective metal layer by preventing the reflective metal layer from being exposed to the outside.

In some implementations, the light emitting diode may further include an upper insulation layer covering at least part of the current spreading layer and including or placed to form openings exposing the reflective electrodes; and the second pad is electrically connected to the reflective electrodes exposed through the openings of the upper insulation layer.

In some implementations, the first pad and the second pad may have the same shape and the same size, thereby facilitating flip-chip bonding.

In some implementations, the light emitting diode may further include a lower insulation layer placed between the plurality of mesas and the current spreading layer and insulating the current spreading layer from the plurality of mesas, wherein the lower insulation layer may include or be placed to form respective openings in the upper regions of the mesas that expose the reflective electrodes.

In some implementations, the openings of the current spreading layer may have a greater width than the openings of the lower insulation layer so as to allow the opening of the lower insulation layer to be completely exposed through the openings of the current spreading layer. In some implementations, sidewalls of the current spreading layer may be placed on the lower insulation layer. In some implementations, the light emitting diode may further include an upper insulation layer covering at least part of the current spreading layer and including or placed to form openings exposing the reflective electrodes. The upper insulation layer may cover sidewalls of the openings of the current spreading layer.

In some implementations, the lower insulation layer may be or include a reflective dielectric layer, for example, a distributed Bragg reflector (DBR).

In another aspect, a light emitting diode is provided to include: a transparent substrate having a first surface and a second surface a first conductive type semiconductor layer placed over the first surface of the transparent substrate; a second conductive type semiconductor layer placed over the first conductive type semiconductor layer; an active layer placed between the first conductive type semiconductor layer and the second conductive type semiconductor layer; a first pad electrically connected to the first conductive type semiconductor layer; and a second pad electrically connected to the second conductive type semiconductor layer, wherein the transparent substrate is configured to enable light generated in the active layer to discharge through the transparent substrate via the second surface of the transparent substrate, and the transparent substrate has a thickness of 225 μm to 400 μm.

In another aspect, a light emitting diode is provided to include: a transparent substrate; a first conductive type semiconductor layer placed over the first surface of the transparent substrate; a second conductive type semiconductor layer placed over the first conductive type semiconductor layer; an active layer placed between the first conductive type semiconductor layer and the second conductive type semiconductor layer; a first pad electrically connected to the first conductive type semiconductor layer; a second pad electrically connected to the second conductive type semiconductor layer; and a conformal coating layer covering the transparent substrate, wherein the transparent substrate and the conformal coating layer are arranged to enable light generated in the active layer to discharge through the conformal coating layer, and a total thickness of the transparent substrate and the conformal coating may range from 225 μm to 600 μm.

In some implementations, the transparent substrate may have a thickness of 150 μm to 400 μm. In some implementations, the conformal coating may have a thickness of 20 μm to 200 μm.

In another aspect, a lighting module is provided to include at least one of light emitting diode comprising: a transparent substrate having a first surface and a second surface; a first conductive type semiconductor layer placed over the first surface of the transparent substrate; a second conductive type semiconductor layer placed over the first conductive type semiconductor layer; an active layer placed between the first conductive type semiconductor layer and the second conductive type semiconductor layer; a first pad electrically connected to the first conductive type semiconductor layer; and a second pad electrically connected to the second conductive type semiconductor layer, wherein the transparent substrate is placed to enable light generated in the active layer to discharge through the second surface of the transparent substrate. Further, the at least one of the light emitting diodes has a beam angle of 140° or more.

In some implementations, the transparent substrate has a thickness of 225 μm to 400 μm.

In some implementations, the at least one of the light emitting diodes may further include a conformal coating layer covering the second surface of the transparent substrate and a total thickness of the transparent substrate and the conformal coating layer may range from 225 μm to 600 μm. In some implementations, the conformal coating may have a thickness of 20 μm to 200 μm.

In some implementations, the active layer and the second conductive type semiconductor layer are patterned to form a plurality of mesas over the first conductive type semiconductor layer, the plurality of mesas being separated from one another.

In some implementations, the at least one light emitting diode further comprises: reflective electrodes placed over the plurality of mesas and forming ohmic contact with the second conductive type semiconductor layer; and a current spreading layer placed over the plurality of mesas and the first conductive type semiconductor layer to form respective openings in upper regions of the plurality of mesas and exposing the reflective electrodes, the current spreading layer forming ohmic contacts with the first conductive type semiconductor layer and being insulated from the plurality of mesas, wherein the first pad is electrically connected to the current spreading layer and the second pad is electrically connected to the reflective electrodes through the openings.

In some implementations, the at least one light emitting diode further comprises a lower insulation layer covering at least a portion of the plurality of mesas and at least a portion of the first conductive type semiconductor layer.

In another aspect, a lighting apparatus is provided to include a lighting module that includes a plurality of light emitting diodes at least one light emitting diode. The at least one light emitting diode includes: a transparent substrate; a first conductive type semiconductor layer placed over the transparent substrate; a second conductive type semiconductor layer placed over the first conductive type semiconductor layer; an active layer placed between the first conductive type semiconductor layer and the second conductive type semiconductor layer; a first pad electrically connected to the first conductive type semiconductor layer; and a second pad electrically connected to the second conductive type semiconductor layer, wherein the transparent substrate is placed to enable light generated in the active layer to discharge through the transparent substrate, and the at least one light emitting diode has a beam angle of 140° or more.

In some implementations, the transparent substrate has a thickness of 225 μm to 400 μm. In some implementations, the at least one light emitting diode further comprises a conformal coating layer placed over the transparent substrate, and a total thickness of the transparent substrate and the conformal coating ranges from 225 μm to 600 μm. In some implementations, the active layer and the second conductive type semiconductor layer are patterned to form a plurality of separate mesas over the first conductive type semiconductor layer. In some implementations, at least one of the plurality of separate mesas extend to an edge of the first conductive type semiconductor layer.

In another aspect, a backlight unit is provided to include at least one light emitting diode comprising: a transparent substrate having a first surface and a second surface; a first conductive type semiconductor layer placed over the first surface of the transparent substrate; a second conductive type semiconductor layer placed over the first conductive type semiconductor layer; an active layer placed between the first conductive type semiconductor layer and the second conductive type semiconductor layer; a first pad electrically connected to the first conductive type semiconductor layer; and a second pad electrically connected to the second conductive type semiconductor layer, wherein the transparent substrate is placed to enable light generated in the active layer is discharged through the transparent substrate via the second surface of the transparent substrate. Further, the at least one light emitting diode has a beam angle of 140° or more.

In some implementations, the transparent substrate may have a thickness of 225 μm to 400 μm.

In some implementations, the at least one light emitting diode may further include a conformal coating layer covering the second surface of the transparent substrate, and a total thickness of the transparent substrate and the conformal coating may range from 225 μm to 600 μm. In some implementations, the conformal coating may have a thickness of 20 μm to 200 μm.

In some implementations, the active layer and the second conductive type semiconductor layer are patterned to form a plurality of mesas over the first conductive type semiconductor layer, the plurality of mesas being separated from one another. In some implementations, the at least one light emitting diode further comprises: reflective electrodes placed over the plurality of mesas and forming ohmic contacts with the second conductive type semiconductor layer; and a current spreading layer covering the plurality of mesas and the first conductive type semiconductor layer and placed to form respective openings in upper regions of the plurality of mesas while exposing the reflective electrodes, the current spreading layer forming ohmic contacts with the first conductive type semiconductor layer and being insulated from the plurality of mesas, wherein the first pad is electrically connected to the current spreading layer and the second pad is electrically connected to the reflective electrodes through the openings.

In some implementations, the at least one light emitting diode further comprises a lower insulation layer covering at least a portion of the plurality of mesas and at least a portion of the first conductive type semiconductor layer. In some implementations, at least one of the plurality of mesas extends to an edge of the first conductive type semiconductor layer.

In another aspect, a light emitting diode is provided to include: a transparent substrate; a first conductive type semiconductor layer placed over the first surface of the transparent substrate; a second conductive type semiconductor layer placed over the first conductive type semiconductor layer; an active layer placed between the first conductive type semiconductor layer and the second conductive type semiconductor layer; a first pad electrically connected to the first conductive type semiconductor layer; and a second pad electrically connected to the second conductive type semiconductor layer, wherein the transparent substrate is placed to enable light generated in the active layer to discharge through the transparent substrate and the transparent substrate has a polygonal shape including at least one acute angle.

Since the amount of light discharged near the acute portion increases, the light emitting diode has improved light extraction efficiency and allows adjustment of beam angles thereof. Accordingly, it is possible to provide a light emitting diode having different beam angles according to directions.

In some implementations, the transparent substrate may have a thickness of 100 µm to 400 µm. In some implementations, the polygonal shape includes a triangular shape, a parallelogram shape or a pentagonal shape. In some implementations, the transparent substrate may be or include a sapphire substrate. In some implementations, the polygonal shape of the transparent substrate includes a parallelogram shape and a side surface of the transparent substrate includes m-planes. Since the side surface of the transparent substrate includes m-planes, wafer scribing may be performed along a crystal plane of the group of m-planes, thereby preventing damage such as chipping during division of the substrate into individual light emitting diodes.

In some implementations, the light emitting diode may further include a reflective electrode placed over the second conductive type semiconductor layer and reflecting light generated in the active layer. In some implementations, the light emitting diode allows light to be reflected by the reflective electrode, thereby improving luminous efficacy.

In some implementations, the active layer and the second conductive type semiconductor layer may be placed within the first conductive type semiconductor layer such that an upper surface of the first conductive type semiconductor layer is exposed along edges of the substrate.

In some implementation, the light emitting diode may further include a current spreading layer connecting the first pad to the first conductive type semiconductor layer, and the first pad and the second pad may be placed above the second conductive type semiconductor layer. This structure can reduce a height difference between the first pad and the second pad, thereby facilitating flip-chip bonding.

In some implementations, the current spreading layer may include a reflective metal. In the light emitting diode, light is reflected by the reflective electrode and the current spreading layer, thereby further improving luminous efficacy of the light emitting diode.

In some implementations, the light emitting diode may further include a lower insulation layer insulating the current spreading layer from the reflective electrode, the lower insulation layer placed to form openings exposing the first conductive type semiconductor layer, wherein the current spreading layer may be connected to the first conductive type semiconductor layer through the openings of the lower insulation layer.

In some implementations, the polygonal shape has at least one obtuse angle and the lower insulating layer is placed to form the openings in an elongated shape along the edges of the transparent substrate such that the openings are farther separated from one another around the at least one acute angle portion than around the at least one obtuse angle portion. With this structure, the light emitting diode can prevent current crowding at the acute angle portion.

In some implementations, the lower insulating layer is placed to form the openings that include a plurality of holes separated from one another along the edges of the transparent substrate and a distance between the holes may increase around the at least one acute angle portion. With this structure, it is possible to relieve current crowding at the acute angle portion.

In some implementations, the first surface has a greater area than the second surface. The first surface having a great area than the second surface further improves light extraction efficiency.

In some implementations, the light emitting diode may further include a conformal coating covering the second surface of the substrate. In some implementations, a total thickness of the transparent substrate and the conformal coating may range from 225 µm to 600 µm, whereby the light emitting diode has increased beam angle of light.

In another aspect, a lighting apparatus is provided to include at least one light emitting diode including: a transparent substrate having a first surface and a second surface; a first conductive type semiconductor layer placed over the first surface of the transparent substrate; a second conductive type semiconductor layer placed over the first conductive type semiconductor layer; an active layer placed between the first conductive type semiconductor layer and the second conductive type semiconductor layer; a first pad electrically connected to the first conductive type semiconductor layer; and a second pad electrically connected to the second conductive type semiconductor layer, wherein the transparent substrate is placed to enable light generated in the active layer is discharged through the transparent substrate via the second surface of the transparent substrate, and the transparent substrate has a polygonal shape including at least one acute angle.

In some implementations, the transparent substrate has a thickness of 100 µm to 400 µm. In some implementations, the polygonal shape includes a triangular shape, a parallelogram shape or a pentagonal shape. In some implementations, the polygonal shape of the transparent substrate has includes a parallelogram shape and a side surface of the transparent substrate includes m-planes. In some implementations, the at least one light emitting diode further comprises a conformal coating covering the second surface of the transparent substrate, and a total thickness of the transparent substrate and the conformal coating ranges from 225 µm to 600 µm.

In another aspect, a light emitting diode is provided to include: a substrate having a first surface and a second surface opposite to the first surface; a first conductive type semiconductor layer placed over the first surface of the substrate; a mesa including an active layer and a second conductive type semiconductor layer sequentially stacked over the first conductive type semiconductor layer, the mesa having a polygonal shape including an acute angle and an obtuse angle and exposing at least a portion of the first conductive type semiconductor layer; a lower insulation layer covering the mesa and placed to form a plurality of first openings exposing the first conductive type semiconductor layer and a second opening exposing the second conductive type semiconductor layer; a first pad electrically connected to the first conductive type semiconductor layer through the first openings; and a second pad electrically connected to the second conductive type semiconductor layer through the second opening, wherein a distance between the first openings near the acute angle of the mesa is greater than a distance between the first openings near the obtuse angle of the mesa. With this structure, the light emitting diode can prevent current crowding.

In some implementations, a distance between the first openings near the acute angle of the mesa is greater than or equal to a current spreading length, and a distance between the first openings near the obtuse angle is less than or equal to the current spreading length.

According to some implementations of the disclosed technology, the flip-chip type light emitting diode has a relatively wide beam angle of light. Accordingly, the flip-chip type light emitting diode may be suitably used in a backlight unit or a sheet-lighting apparatus. For example, in arrangement of light emitting diodes having a wide beam angle, it is possible to reduce the number of light emitting diodes or to achieve a slim structure of the backlight unit or the lighting module.

According to embodiments of the disclosed technology, the flip-chip type light emitting diode has improved light extraction efficiency through improvement in reflectivity, and has improved current spreading performance.

According to embodiments of the disclosed technology, the flip-chip type light emitting diode adopts a substrate including at least one acute angle portion, thereby improving luminous efficacy while exhibiting different beam angles of light according to directions. Further, a lighting apparatus employs such a light emitting diode, thereby enabling illumination of a wide area while reducing light loss.

BRIEF DESCRIPTION OF DRAWINGS

FIGS. 1(a) through 5(b) are views illustrating an exemplary method of fabricating a light emitting diode according to one embodiment of the disclosed technology, in which (a) shows a plan view and (b) shows a sectional view taken along line A-A.

DETAILED DESCRIPTION

Figure 1A:
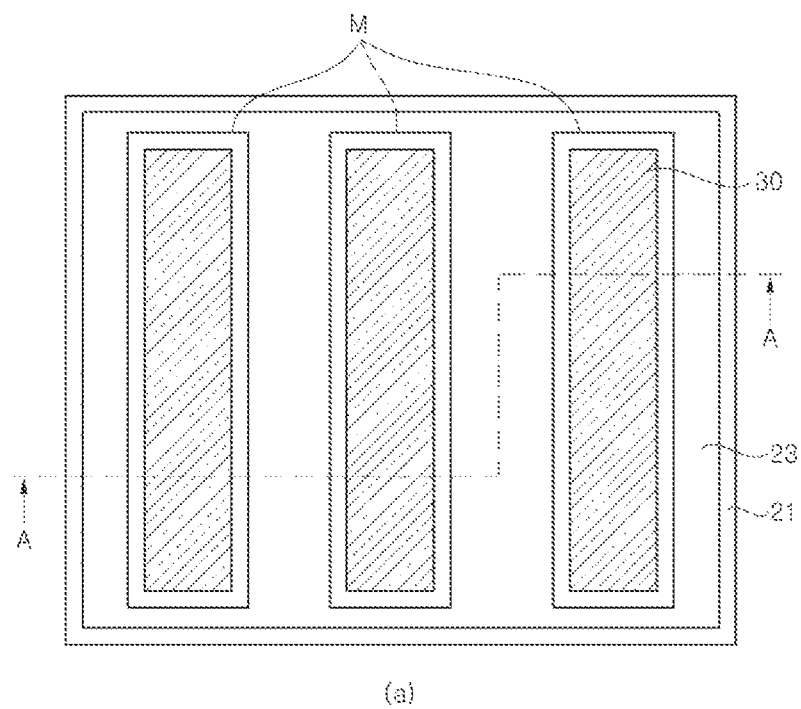

Hereinafter, various implementations of the disclosed technology will be described in more detail with reference to the accompanying drawings. The following embodiments are provided by way of example so as to facilitate the understanding of the various implementations of the disclosed technology. Accordingly, the disclosed technology is not limited to the embodiments disclosed herein and can also be implemented in various different forms. In the drawings, certain aspects such as widths, lengths, thicknesses, and the like of elements may be exaggerated for clarity and descriptive purposes. Throughout the specification, like reference numerals denote like elements having the same or similar functions.

First, a method of fabricating a light emitting diode will be described to aid in understanding of the structure of a flip-chip type light emitting diode according to one embodiment of the disclosed technology.

FIG. 1(a) through FIG. 5(b) are views illustrating a method of fabricating a light emitting diode according to one embodiment of the disclosed technology, in which (a) shows a plan view and (b) shows a sectional view taken along line A-A.

Figure 1B:
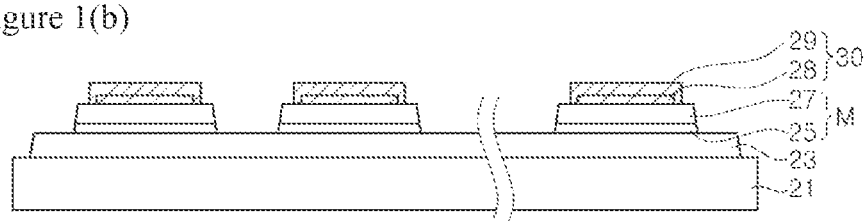

First, referring to FIGS. 1(a) and 1(b), a first conductive type semiconductor layer 23 is formed on a substrate 21, and an active layer 25 and a second conductive type semiconductor layer 27 are placed on the first conductive type semiconductor layer 23. The substrate 21 is or includes a substrate for growth of GaN-based semiconductor layers and may be or include, for example, a sapphire substrate, a silicon carbide substrate, a gallium nitride substrate, an indium gallium nitride substrate, an aluminum gallium nitride substrate, an aluminum nitride substrate, a gallium oxide substrate, and the like. In some implementations, the substrate 21 may be or include a sapphire substrate.

The first conductive type semiconductor layer 23 may be or include a nitride-based semiconductor layer doped with n-type impurities. In one embodiment, the first conductive type semiconductor layer 23 may be or include an $In_xAl_yGa_{1-x-y}N$ layer ($0 \leq x \leq 1$, $0 \leq y \leq 1$, $0 \leq x+y \leq 1$) doped with Si. For example, the first conductive type semiconductor layer 23 may be or include a Si-doped GaN layer. The second conductive type semiconductor layer 27 may be or include a nitride-based semiconductor layer doped with p-type impurities. In one embodiment, the second conductive type semiconductor layer 27 may be or include an $In_xAl_yGa_{1-x-y}N$ layer (0≤x≤1, 0≤y≤1, 0≤x+y≤1) doped with Mg or Zn. For example, the second conductive type semiconductor layer 27 may be or include a Mg-doped GaN layer. The active layer 25 may include a well layer including $In_xAl_yGa_{1-x-y}N$ (0≤x≤1, 0≤y≤1, 0≤x+y≤1) and may have a single quantum well structure or a multi-quantum well structure. In one embodiment, the active layer 25 may have a single quantum well structure including an InGaN, GaN or AlGaN layer, or a multi-quantum well structure including InGaN/GaN layers, GaN/AlGaN layers, or AlGaN/AlGaN layers.

The first conductive type semiconductor layer 23, the active layer 25 and the second conductive type semiconductor layer 27 may be formed by metal organic chemical vapor deposition (MOCVD) or molecular beam epitaxy (MBE).

A plurality of mesas M may be formed on the first conductive type semiconductor layer 23 to be separated from each other, and each of the mesas M may include the active layer 25 and the second conductive type semiconductor layer 27. The active layer 25 is placed between the first conductive type semiconductor layer 23 and the second conductive type semiconductor layer 27. On the other hand, a reflective electrode 30 is placed on each of the mesas M.

The plural mesas M may be formed by growing epitaxial layers including the first conductive type semiconductor layer 23, the active layer 25 and the second conductive type semiconductor layer 27 on the first surface of the substrate 21 through metal organic chemical vapor deposition or the like, followed by patterning the second conductive type semiconductor layer 27 and the active layer 25 so as to expose the first conductive type semiconductor layer 23. The plural mesas M may be formed to have inclined side surfaces using photoresist reflow technology. The inclined profile of the side surfaces of the mesas M improves extraction efficiency of light generated in the active layer 25.

As shown, the plural mesas M may have an elongated shape extending in one direction and be disposed parallel to each other. Such a shape simplifies formation of the plural mesas M having the same shape in a plurality of chip areas on the substrate 21.

On the other hand, the reflective electrodes 30 may be formed on the respective mesas M after formation of the plural mesas M, without being limited thereto. Alternatively, the reflective electrodes 30 may be formed on the second conductive type semiconductor layer 27 before formation of the mesas M after growing the second conductive type semiconductor layer 27. The reflective electrodes 30 cover most regions of upper surfaces of the mesas M and have substantially the same shape as the shape of the mesas M in plan view.

The reflective electrode 30 includes a reflective layer 28 and may further include a barrier layer 29. The barrier layer 29 may cover an upper surface and a side surface of the reflective layer 28. For example, the barrier layer 29 may be formed to cover the upper and side surfaces of the reflective layer 28 by forming a pattern of the reflective layer 28 and forming the barrier layer 29 on the patterned reflective layer 28. For example, the reflective layer 28 may be formed by deposition and patterning of layers including Ag, Ag alloy, Ni/Ag, NiZn/Ag, or TiO/Ag layers. On the other hand, the barrier layer 29 may be formed to include Ni, Cr, Ti, Pt or combinations thereof and prevents diffusion or contamination of metallic materials in the reflective layer 28.

After forming the plural mesas M, an edge of the first conductive type semiconductor layer 23 may also be etched. As a result, an upper surface of the substrate 21 can be exposed. The first conductive type semiconductor layer 23 may also be formed to have an inclined side surface.

Figure 6:
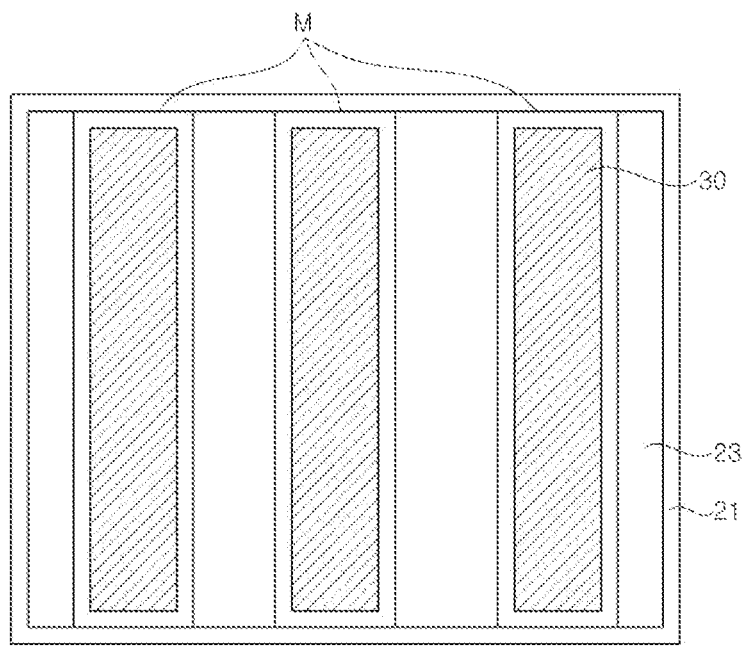
FIG. 6 is a plan view of an exemplary modification of a mesa structure.

As shown in FIGS. 1(a) and 1(b), the plurality of mesas M may be placed inside the first conductive type semiconductor layer 23. For example, the plurality of mesas M may be placed in island shapes within an upper region of the first conductive type semiconductor layer 23. Alternatively, the mesas M may extend in one direction to reach edges of the upper surface of the first conductive type semiconductor layer 23, as shown in FIG. 6. For example, in one direction, the edges of lower surfaces of the plurality of mesas M may coincide with the edges of the first conductive type semiconductor layer 23. With this structure, the upper surface of the first conductive type semiconductor layer 23 is partitioned by the plurality of mesas M.

Figure 2A:
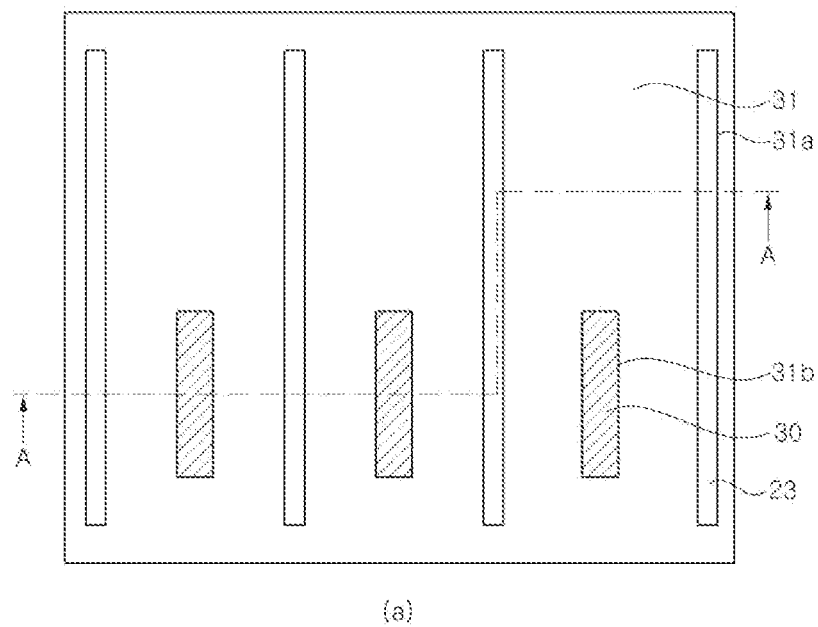
Figure 2B:
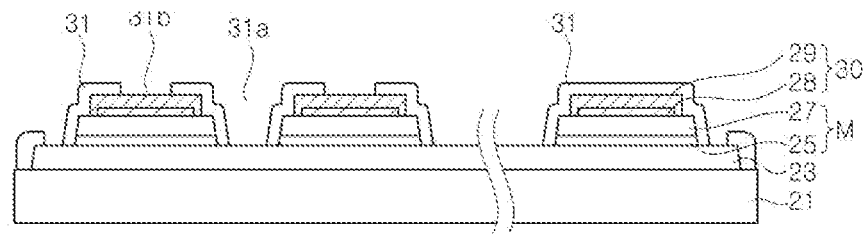

Referring to FIGS. 2(a) and 2(b), a lower insulation layer 31 is formed to cover the plurality of mesas M and the first conductive type semiconductor layer 23. The lower insulation layer 31 includes or is placed to form openings 31a and 31b to allow electrical connection to the first conductive-type semiconductor layer 23 and the second conductive-type semiconductor layer 27. For example, the lower insulation layer 31 may include or be placed to form openings 31a which expose the first conductive-type semiconductor layer 23 and openings 31b which expose the reflective electrodes 30.

The openings 31a may be placed between the mesas M and near edges of the substrate 21, and may have an elongated shape extending along the mesas M. On the other hand, the openings 31b are placed in upper regions of the mesas M to be located towards the one end of the mesas.

The lower insulation layer 31 may be formed to include oxides such as $SiO_2$, nitrides such as SiNx, or insulation materials such as $MgF_2$ by chemical vapor deposition (CVD) or the like. The lower insulation layer 31 may be composed of a single layer or multiple layers. In addition, the lower insulation layer 31 may be formed as a distributed Bragg reflector (DBR) in which low refractive material layers and high refractive material layers are alternately stacked one above another. For example, an insulation reflective layer having high reflectivity may be formed by stacking, for example, $SiO_2/TiO_2$ layers or $SiO_2/Nb_2O_5$ layers.

Figure 3A:
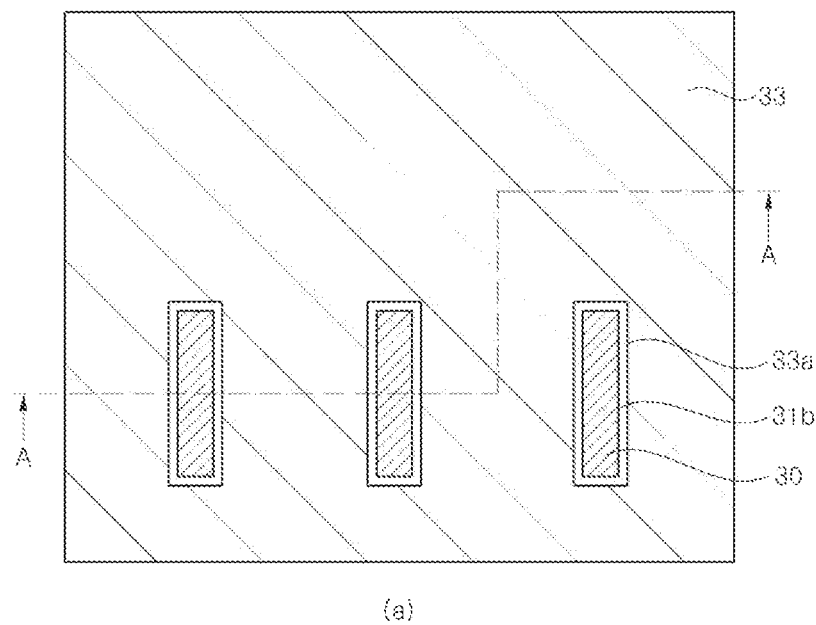
Figure 3B:
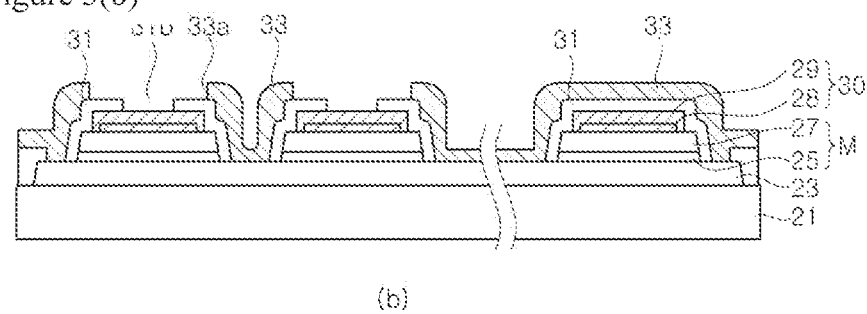

Referring to FIGS. 3(a) and 3(b), a current spreading layer 33 is formed on the lower insulation layer 31. The current spreading layer 33 covers the plurality of mesas M and the first conductive-type semiconductor layer 23. In addition, the current spreading layer 33 includes or is placed to form openings 33a, which are respectively placed in the upper regions of the mesas M and expose the reflective electrodes 30. The current spreading layer 33 may form ohmic contacts with the first conductive-type semiconductor layer 23 through the openings 31a of the lower insulation layer 31. The current spreading layer 33 is insulated from the plurality of mesas M and the reflective electrodes 30 by the lower insulation layer 31.

Each of the openings 33a of the current spreading layer 33 has a greater area than the openings 31b of the lower insulation layer 31 to prevent the current spreading layer 33 from being connected to the reflective electrodes 30. Thus, the openings 33a have sidewalls placed on the lower insulation layer 31.

The current spreading layer 33 is formed substantially over the entirety of the upper surface of the substrate 31 excluding the openings 33a. Accordingly, current can easily spread through the current spreading layer 33. The current spreading layer 33 may include a highly reflective metal layer such as an Al layer, and the highly reflective metal layer may be formed on a bonding layer such as a Ti, Cr or Ni layer. In addition, a protective layer having a single layer or composite layer structure including Ni, Cr, Au, and the like may be formed on the highly reflective metal layer. The current spreading layer 33 may have a multilayer structure including, for example, Ti/Al/Ti/Ni/Au.

Figure 4A:
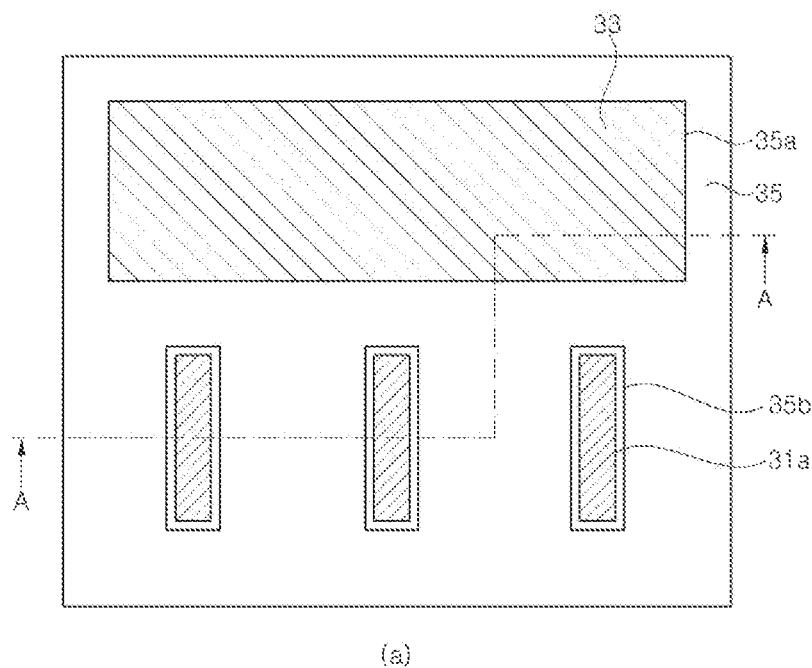
Figure 4B:
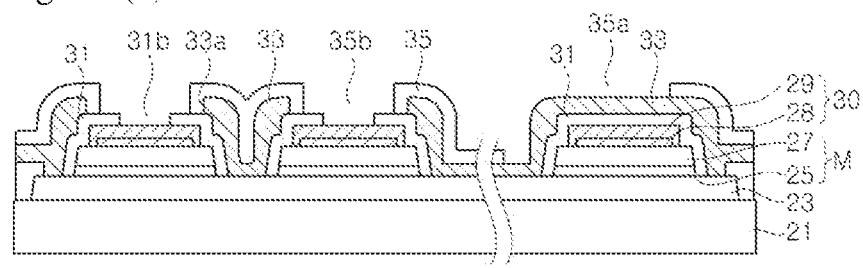

Referring to FIGS. 4(a) and 4(b), an upper insulation layer 35 is formed on the current spreading layer 33. The upper insulation layer 35 includes or is placed to form an opening 35a which exposes the current spreading layer 33, and openings 35b which expose the reflective electrodes 30. The opening 35a may have an elongated shape in a perpendicular direction with respect to the longitudinal direction of the mesas M, and has a greater area than the openings 35b. The openings 35b expose the reflective electrodes 30, which are exposed through the openings 33a of the current spreading layer 33 and the openings 31b of the lower insulation layer 31. The openings 35b have a narrower area than the openings 33a of the current spreading layer 33 and a greater area than the openings 31b of the lower insulation layer 31. Accordingly, the sidewalls of the openings 33a of the current spreading layer 33 may be covered by the upper insulation layer 35.

The upper insulation layer 35 may be formed to include an oxide insulation layer, a nitride insulation layer, or a polymer such as polyimide, Teflon, Parylene, or the like.

Referring to FIGS. 5(a) and 5(b), a first pad 37a and a second pad 37b are formed on the upper insulation layer 35. The first pad 37a is connected to the current spreading layer 33 through the opening 35a of the upper insulation layer 35, and the second pad 37b is connected to the reflective electrodes 30 through the openings 35b of the upper insulation layer 35. The first and second pads 37a and 37b may be used as pads for connection of bumps for mounting the light emitting diode on a sub-mount, a package, or a printed circuit board, or pads for surface mount technology (SMT).

The first and second pads 37a and 37b may be formed simultaneously by the same process, for example, a photolithography and etching process or a lift-off process. The first and second pads 37a and 37b may include a bonding layer including, for example, Ti, Cr, Ni or the like, and a high conductivity metal layer including Al, Cu, Ag, Au or the like.

Then, the substrate 21 is divided into individual light emitting diode chips, thereby providing light emitting diode chips. The substrate 21 may be subjected to a thinning process to have a thinner thickness before being divided into the individual light emitting diode chips.

Hereinafter, the structure of a light emitting diode 100 according to one embodiment of the disclosed technology will be described in detail with reference to FIG. 7.

The light emitting diode includes a substrate 21, a first conductive type semiconductor layer 23, an active layer 25, a second conductive type semiconductor layer 27, a first pad 37a, and a second pad 37b, and may further include reflective electrodes 30, a current spreading layer 33, a lower insulation layer 31, an upper insulation layer 35 and mesas M.

The substrate 21 may be or include a growth substrate for growth of gallium nitride-based epitaxial layers, for example, a sapphire substrate, a silicon carbide substrate, or a gallium nitride substrate. The substrate 21 may include a first surface 21a, a second surface 21b, and a side surface 21c. The first surface 21a is a plane on which semiconductor layers are grown, and the second surface 21b is a plane through which light generated in the active layer 25 is discharged to the outside. The side surface 21c connects the first surface 21a to the second surface 21b. The side surface 21c of the substrate 21 may be perpendicular to the first surface 21a and the second surface 21b, without being limited thereto. Alternatively, the side surface 21b of the substrate 21 may be inclined. For example, as indicated by a dotted line in FIG. 7, the substrate 21 may have an inclined side surface 21d such that the first surface 21a has a greater area than the second surface 21b. In this embodiment, the substrate 21 may have a thickness (t1) of 225 µm to 400 µm.

The first conductive type semiconductor layer 23 is placed on the first surface 21a of the substrate 21. The first conductive type semiconductor layer 23 is continuous, and the active layer 25 and the second conductive type semiconductor layer 27 are placed on the first conductive type semiconductor layer 23. The plural mesas M are placed to be separated from each other on the first conductive type semiconductor layer 23. As illustrated with reference to FIGS. 1(a) and 1(b), the mesas M include the active layer 25 and the second conductive type semiconductor 27 and have an elongated shape extending toward one side. Here, the mesas M are formed of a stack of gallium nitride compound semiconductor layers. As shown in FIGS. 1(a) and 1(b), the mesas M may be placed within the first conductive type semiconductor layer 23. For example, the mesas M may be placed within an upper region of the first conductive type semiconductor layer 23. Alternatively, as shown in FIG. 6, the mesas M may extend to edges of the upper surface of the first conductive type semiconductor layer 23 in one direction, whereby the upper surface of the first conductive type semiconductor layer 23 can be divided into plural regions. With this structure, the light emitting diode can relieve current crowding near corners of the mesas M, thereby further improving current spreading performance.

The reflective electrodes 30 are placed on the plural mesas M to form ohmic contacts with the second conductive type semiconductor layer 27. As illustrated with reference to FIGS. 1(a) and 1(b), the reflective electrodes 300 may include the reflective layer 28 and the barrier layer 29, and the barrier layer 29 may cover an upper surface and a side surface of the reflective layer 28.

The current spreading layer 33 covers the plural mesas M and the first conductive type semiconductor layer 23. The current spreading layer 33 has or is placed to form openings 33a respectively placed in upper regions of the respective mesas M such that the reflective electrodes 30 are exposed therethrough. The current spreading layer 33 may cover the overall area of the mesas M excluding some regions of the upper regions of the mesas M in which the openings 33a are formed, and may also cover the overall area of the first conductive type semiconductor layer 23. The current spreading layer 33 also forms ohmic contacts with the first conductive type semiconductor layer 23 and is insulated from the plural mesas M. The current spreading layer 33 may include a reflective metal such as Al.

The current spreading layer 33 may be insulated from the plural mesas M by the lower insulation layer 31. For example, the lower insulation layer 31 may be interposed between the plural mesas M and the current spreading layer 33 to insulate the current spreading layer 33 from the plural mesas M. In addition, the lower insulation layer 31 may have or is placed to form openings 31b placed within the upper regions of the respective mesas M such that the reflective electrodes 30 are exposed therethrough, and openings 31a that expose the first conductive type semiconductor layer 23 therethrough. The current spreading layer 33 may be connected to the first conductive type semiconductor layer 23 through the openings 31a. The opening 31b of the lower insulation layer 31 has a smaller area than the opening 33a of the current spreading layer 33, and is completely exposed through the opening 33a.

The upper insulation layer 35 covers at least a portion of the current spreading layer 33. The upper insulation layer 35 has or is placed to form openings 35b that expose the reflective electrodes 30. In addition, the upper insulation layer 35 may have or be placed to form an opening 35a that exposes the current spreading layer 33. The upper insulation layer 35 may cover sidewalls of the openings 33a of the current spreading layer 33.

The first pad 37a may be placed on the current spreading layer 33 and, for example, may be connected to the current spreading layer 33 through the opening 35a of the upper insulation layer 35. The first pad 37a is electrically connected to the first conductive type semiconductor layer 23 through the current spreading layer 33. In addition, the second pad 37b is connected to the reflective electrodes 30 exposed through the openings 35b and electrically connected to the second conductive type semiconductor layer 27 through the reflective electrodes 30.

According to this embodiment, since the substrate 21 has a thickness t1 of 225 µm or more, the beam angle of the light emitting diode 100 can be increased to 140° or more. Further, since the current spreading layer 33 covers the mesas M and substantially cover the overall area of the first conductive type semiconductor layer 23 between the mesas M, current can be easily spread through the current spreading layer 33.

In addition, the current spreading layer 23 includes a reflective metal layer such as an Al layer or the lower insulation layer is formed as an insulation reflective layer, whereby light not reflected by the reflective electrodes 30 can be reflected by the current spreading layer 23 or the lower insulation layer 31, thereby improving light extraction efficiency.

Figure 8:
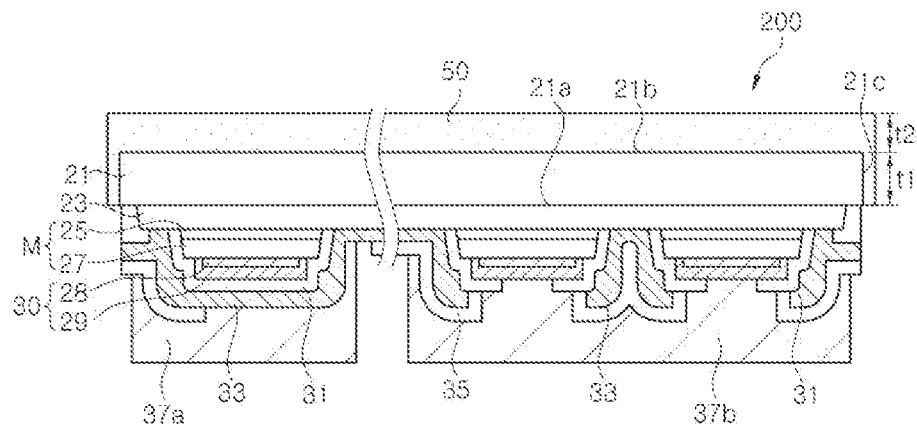
FIG. 8 is a sectional view of an exemplary light emitting diode according to another embodiment of the disclosed technology.
Figure 9:
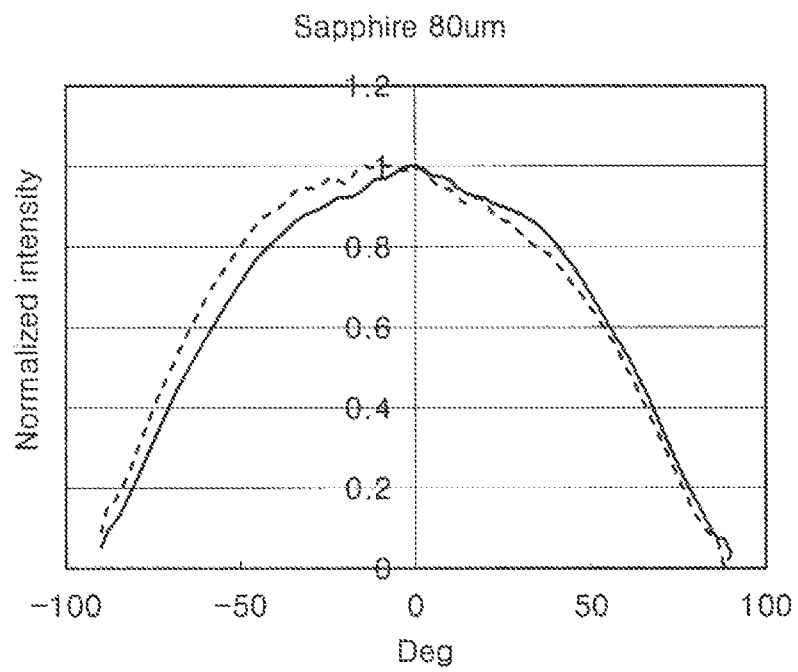
FIGS. 9 to 12 are graphs depicting beam angle characteristics of light emitting diodes depending on thickness of substrates.
Figure 10:
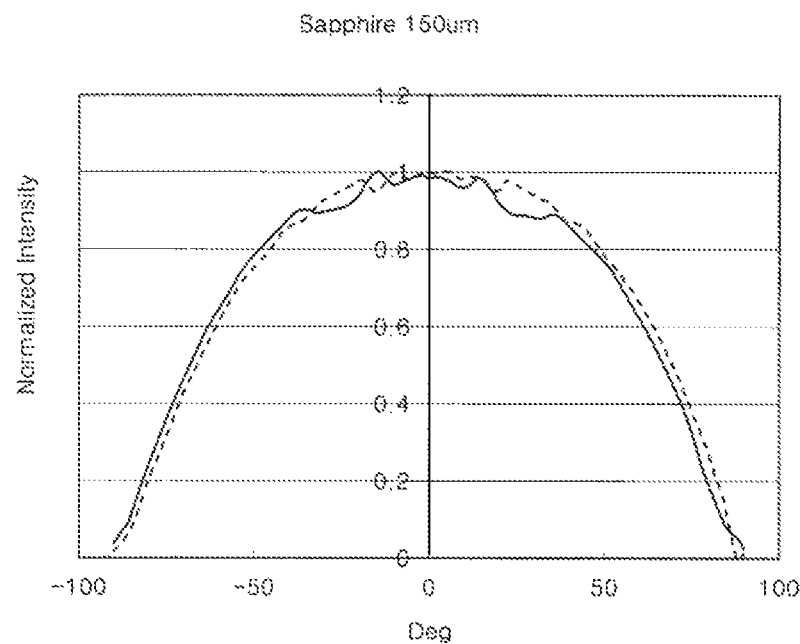
Figure 11:
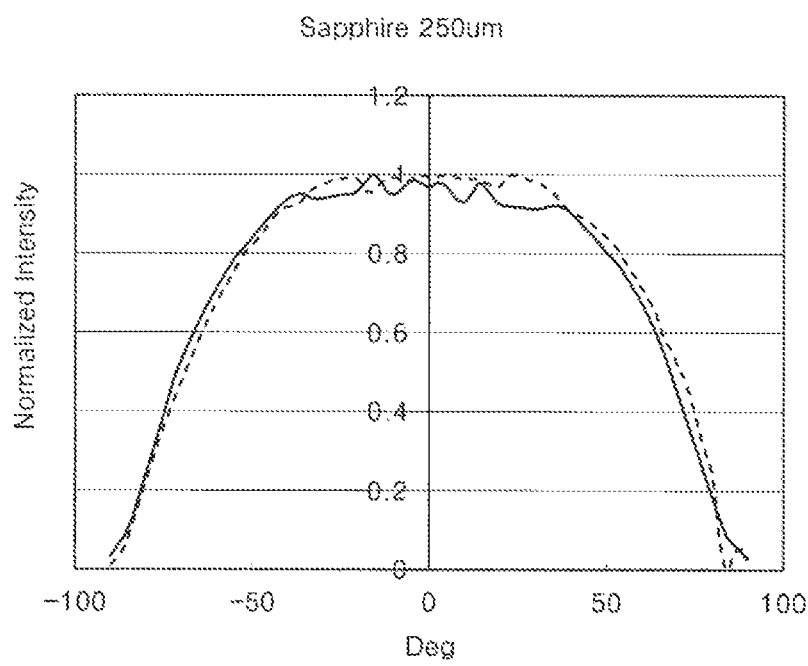
Figure 12:
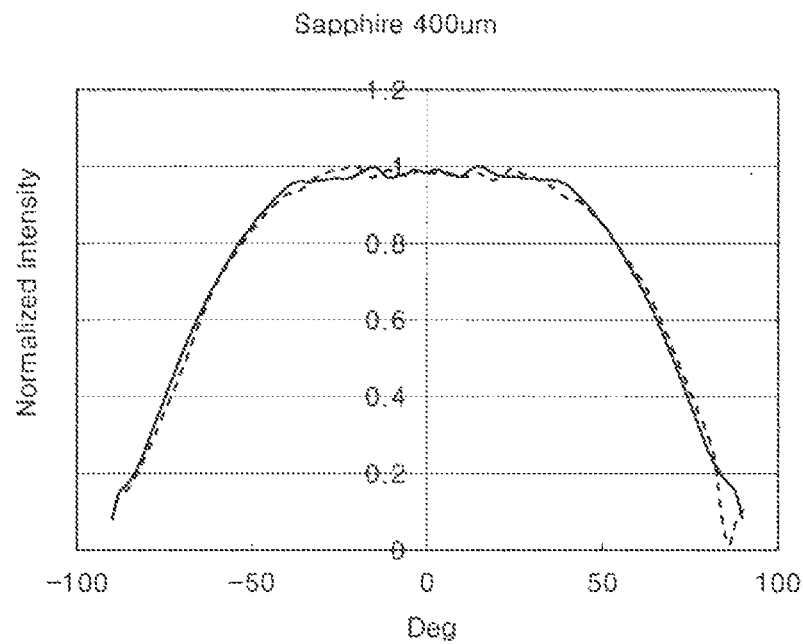

FIG. 8 is a sectional view of a light emitting diode 200 according to another embodiment of the disclosed technology.

Figure 7:
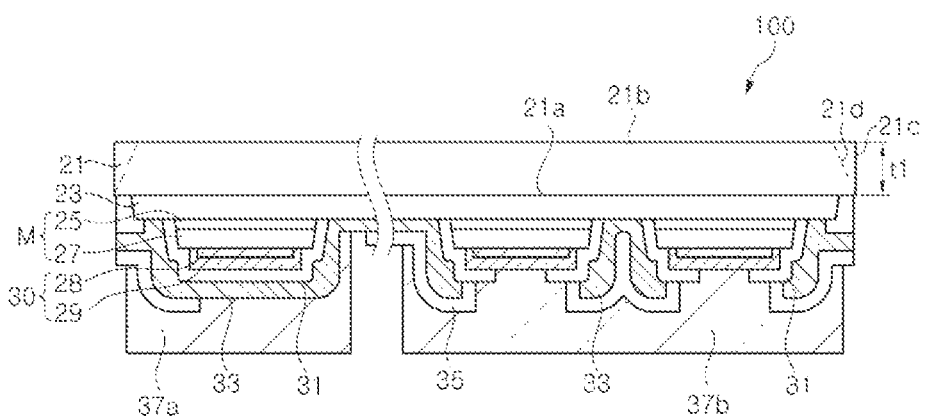
FIG. 7 is a sectional view of an exemplary light emitting diode according to one embodiment of the disclosed technology.

The light emitting diode 200 according to this embodiment is generally similar to the light emitting diode 100 of FIG. 7 except for a conformal coating 50 placed on the substrate 21. The conformal coating 50 covers the second surface 21b of the substrate 21 and may also cover the side surface 21c of the substrate 21. The conformal coating 50 may have a uniform thickness. The conformal coating 50 may contain a wavelength conversion material such as phosphors.

Further, the sum of a thickness t1 of the substrate 21 and a thickness t2 of the conformal coating 50 may range from 225 µm to 600 µm. For example, the conformal coating 50 may have a thickness t2 of 20 µm to 200 µm. Further, the thickness t1 of the substrate 21 may vary depending upon the thickness t2 of the conformal coating, for example, may range from 150 µm to 400 µm.

When the sum (t1+t2) of the thickness t1 of the substrate 21 and the thickness t2 of the conformal coating 50 is greater than or equal to 225 µm, the beam angle of the light emitting diode 200 can be increased to 140° or more.

FIGS. 9 to 12 are graphs depicting beam angle characteristics of light emitting diodes depending on thickness of substrates. In each of the graphs, a solid line indicates beam angle characteristics in a first axis (for example, x-axis) and a dotted line indicates beam angle characteristics in a second axis (for example, y-axis) orthogonal to the first axis.

As the substrate 21, a sapphire substrate was used, and light emitting diodes having the structure as shown in FIG. 7 were fabricated with different thicknesses of the sapphire substrates 21. The light emitting diodes had a size of 1 mm×1 mm and the sapphire substrates 21 had thicknesses of about 80 µm, 150 µm, 250 µm, and 400 µm, respectively.

Referring to FIGS. 9 to 12, it can be confirmed that beam distribution was widened by increasing thickness of the substrate 21 from 80 µm to 250 µm. However, when the thickness of the substrate 21 was increased from 250 µm to 400 µm, there was no significant difference in beam distribution.

Figure 13:
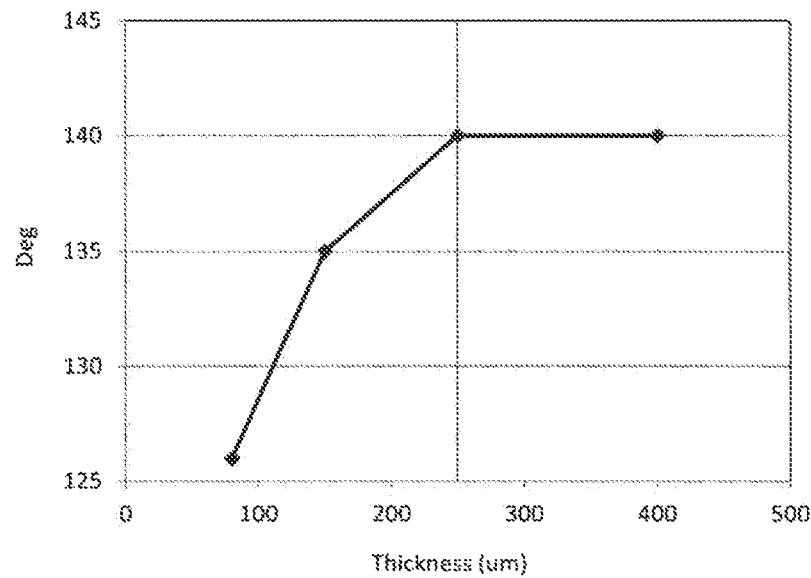
FIG. 13 is a graph depicting a relationship between beam angle and substrate thickness of light emitting diodes.
Figure 14:
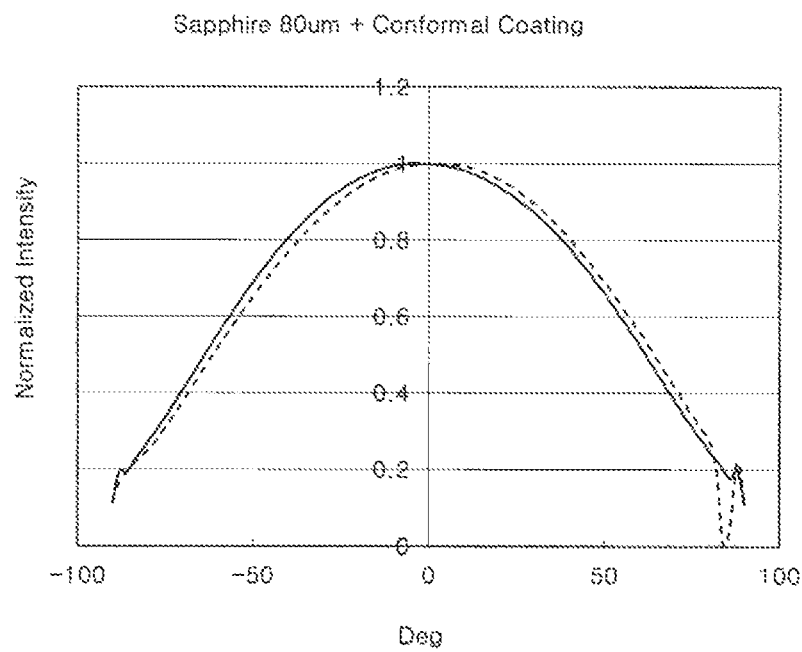
FIGS. 14 to 17 are graphs depicting beam angle characteristics of light emitting diodes each having a conformal coating depending on thickness of substrates.
Figure 15:
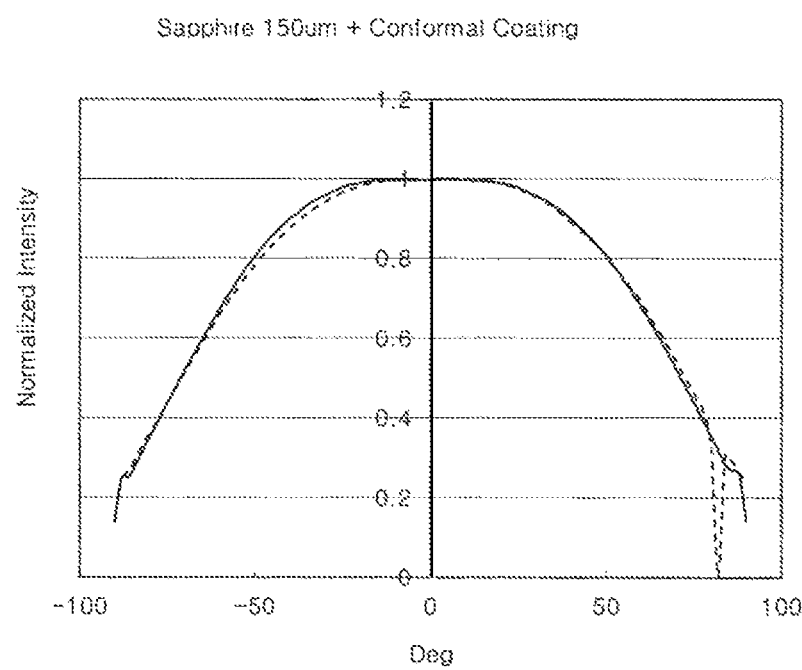
Figure 16:
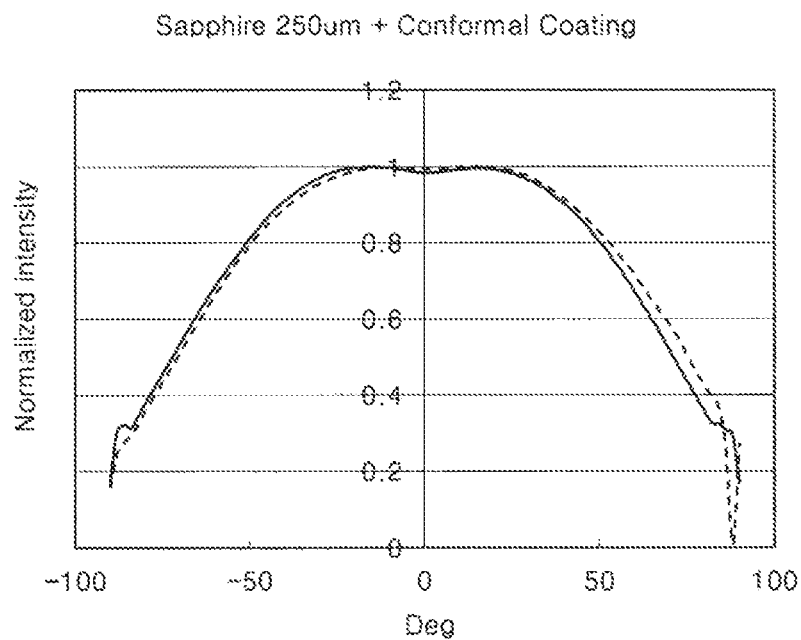
Figure 17:
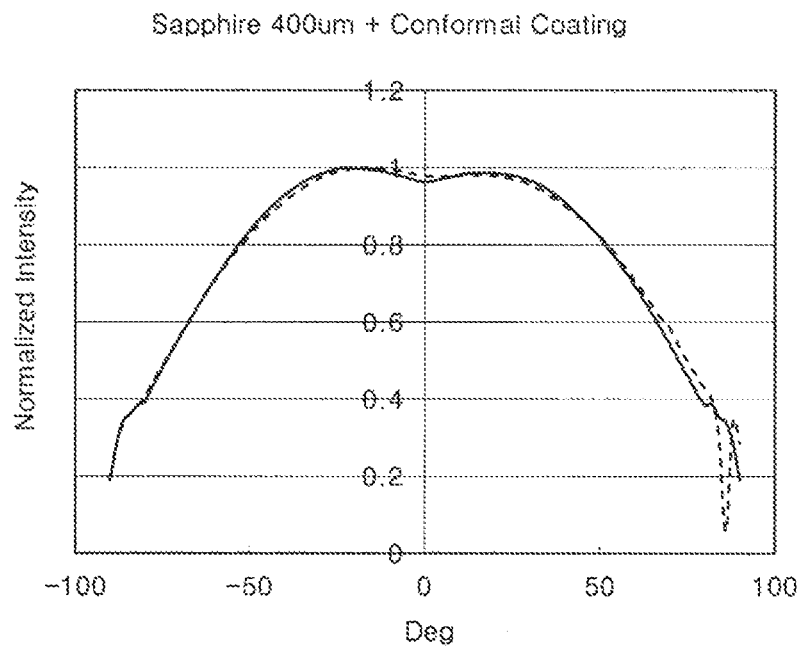

FIG. 13 is a graph depicting a relationship between beam angle and substrate thickness of the light emitting diodes that is obtained from FIGS. 9 to 12. The term "beam angle" means the range of angles in which luminous flux of half or more the maximum luminous flux is exhibited. The "beam angle" corresponds to an angle from a minimum angle to a maximum angle at which a normalized strength becomes 0.5 in a beam distribution graph.

Referring to FIG. 13, as the thickness t1 of the substrate 21 was increased to 250 µm, the beam angle was increased to about 140°, and when the thickness t1 of the substrate 21 was 250 µm or more, there was no significant change in the beam angle.

Accordingly, when the thickness t1 of the substrate 21 is set to 250 µm, the beam angle can be maintained at 140° without other transparent films on the substrate 21, and there is no significant change in beam angle even when the thickness t1 of the substrate 21 is increased.

FIGS. 14 to 17 are graphs depicting beam angle characteristics of light emitting diodes 200 each having a conformal coating depending on various substrate thicknesses (t1). In each of the graphs, a solid line indicates beam angle characteristics in a first axis (for example, x-axis) and a dotted line indicates beam angle characteristics in a second axis (for example, y-axis) orthogonal to the first axis.

As described with reference to FIGS. 9 to 12, sapphire substrates 21 having different thicknesses t1 were used and a conformal coating 50 was formed to a thickness t2 of about 75 µm on each of the substrates 21, thereby fabricating light emitting diodes 200, as shown in FIG. 8.

Referring to FIGS. 14 to 17, it can be confirmed that beam distribution was significantly changed by increasing thickness of the substrate 21 from 80 µm to 150 µm. In addition, as the thickness of the substrate 21 was increased from 150 µm to 400 µm, there was no significant change in beam distribution although luminous flux slightly decreases near 0°.

Figure 18:
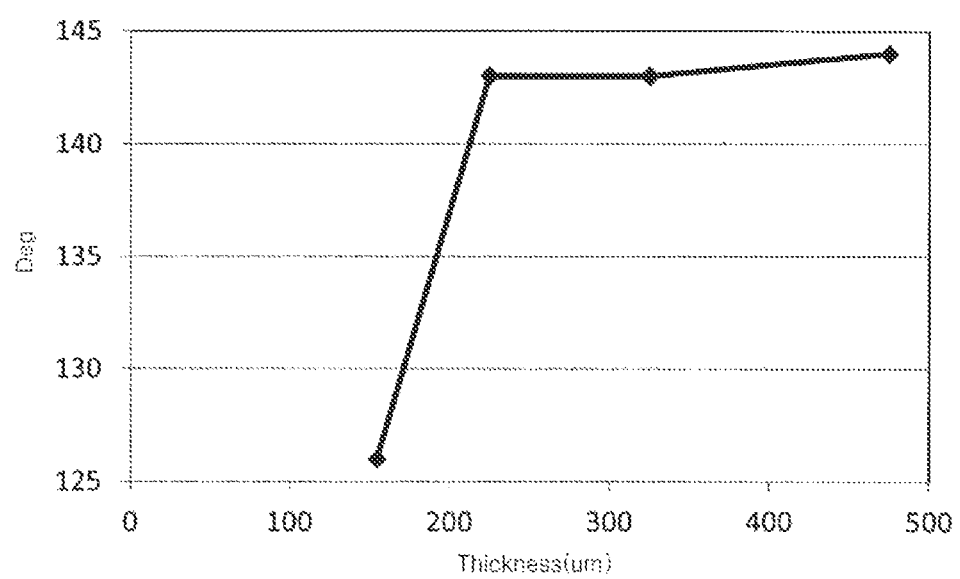
FIG. 18 is a graph depicting a relationship between beam angle and substrate thickness of light emitting diodes each having a conformal coating.

FIG. 18 is a graph depicting a relationship between beam angle and substrate thickness t1 of the light emitting diodes 200 that is obtained from FIGS. 14 to 17, each of which includes the conformal coating 50.

Referring to FIG. 18, as the thickness t1 of the substrate 21 was increased to 150 µm, the beam angle was increased to about 143°, and when the thickness t1 of the substrate 21 was 150 µm or more, there was no significant change in the beam angle. Thus, it can be seen that, when the sum of the thickness t1 of the substrate 21 and the thickness t2 of the conformal coating 50 reaches 225 µm or more, the beam angle finally reaches a value of 140° or more.

Accordingly, when the sum of the thickness of the substrate 21 and the thickness of the conformal coating 50 is set to 225 µm or more, the light emitting diode 200 can have a beam angle of 140° or more.

From the experimental results, it is anticipated that, even when the substrate has a thickness of about 225 µm without the conformal coating 50, the light emitting diode 200 having a beam angle of 140° or more will be provided.

Figure 19A:
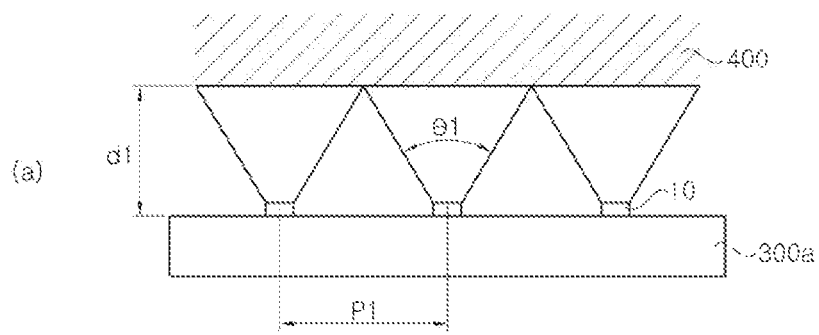
FIGS. 19(a) through 19(c) shows schematic sectional views of a light emitting diode module employing typical light emitting diodes and light emitting diode modules employing light emitting diodes according to one implementation of the disclosed technology.
Figure 19B:
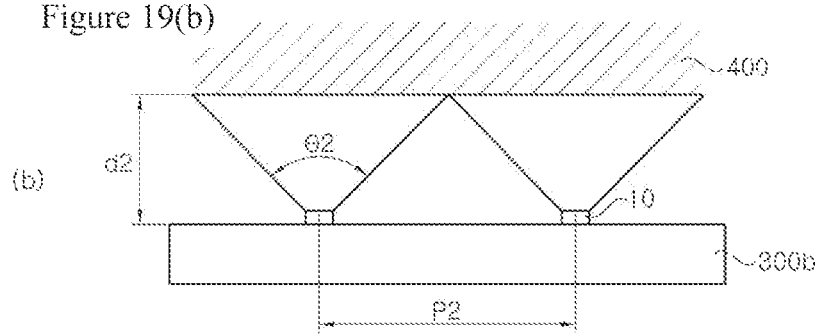
Figure 19C:
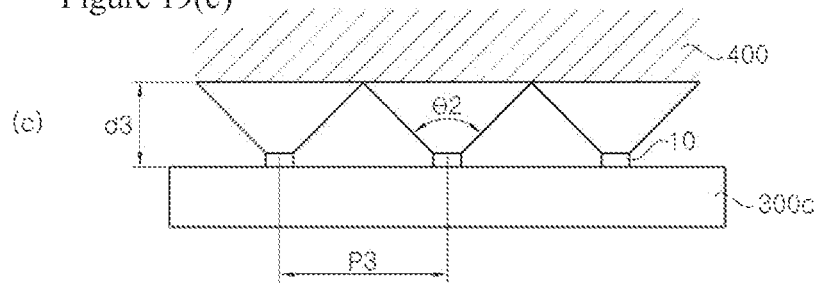

FIGS. 19(a), 19(b), and 19(c) show schematic sectional views of a light emitting diode module 300a employing typical light emitting diodes 10 and light emitting diode modules 300b and 300c employing light emitting diodes 100 according to some implementations of the disclosed technology. Here, the light emitting diode modules 300a, 300b and 300c will be illustrated by way of example as being used in a backlight unit for illuminating a liquid crystal display panel 400.

Referring to FIGS. 19(a), 19(b), and 19(c), the typical light emitting diode 10 has a beam angle ($\theta_1$) of about 120°, whereas the light emitting diode 100 according to some implementations of the disclosed technology has a beam angle ($\theta_2$) of about 140° or more.

A distance between the light emitting diode module and the LCD panel 400 can be represented by d, a pitch of the light emitting diodes can be represented by p, and the beam angles of the light emitting diodes can be represented by θ. On the other hand, when the light emitting diodes are arranged to prevent the beam angles of the light emitting diodes from overlapping each other, the pitch p indicates a width of an area of the LCD panel 400 illuminated by a single light emitting diode and is represented by the following Equation 1.

$$p = 2 \cdot d \cdot \tan(\theta/2). \quad \text{(Equation 1)}$$

Thus, the pitch p1 of the typical light emitting diode module 300a and the pitch p2 of the light emitting diode module 300b according to some implementations of the disclosed technology are represented by Equations (2) and (3).

$$p1 = 2 \cdot d1 \cdot \tan(\theta_1/2). \quad \text{(Equation 2)}$$

$$p2 = 2 \cdot d2 \cdot \tan(\theta_2/2). \quad \text{(Equation 3)}$$

Here, since the beam angle ($\theta_2$) of the light emitting diode 100 is greater than the beam angle ($\theta_1$) of the light emitting diode 10 and $\theta_2/2$ is less than 90°, the following Equation 4 is established.

$$\tan(\theta_1/2) < \tan(\theta_2/2). \quad \text{(Equation 4)}$$

Accordingly, if d1=d2 in Equations 2 and 3, the following Equation 5 is established.

$$p2 > p1 \text{(when } d1 = d2\text{)}. \quad \text{(Equation 5)}$$

That is, when the light emitting diode modules 300a and 300b shown in FIGS. 19(a) and (b) are separated from the LCD panel 400 by the same distance (d1=d2) and illuminate the same area of the LCD panel 400, the light emitting diode module 300b according to some implementations of the disclosed technology allows the light emitting diodes 100 to be arranged at wider intervals than the typical light emitting diode module 300a. Accordingly, it is possible to reduce the number of light emitting diodes 100 included in the light emitting diode module 300b.

On the other hand, as shown in FIGS. 19(a) and (c), when the pitch p1 of the light emitting diodes of the typical light emitting diode module 300a is the same as the pitch p3 of the light emitting diodes 100 of the light emitting diode module 300c according to some implementations of the disclosed technology, the following Equation 6 is established.

$$d3 < d1 \text{(when } p1 = p3\text{)}. \quad \text{(Equation 6)}$$

That is, when the light emitting diode modules 300a and 300c include the same number of light emitting diodes, the light emitting diode module 300c according to some implementations of the disclosed technology can be placed closer to the LCD panel 400 than the light emitting diode module 300a, thereby enabling reduction in thickness of a backlight unit and a liquid crystal display.

Herein, although the light emitting diode modules 300a, 300b and 300c are illustrated as being used in the backlight unit, the light emitting diode modules 300a, 300b and 300c may also be used as a lighting module for lighting apparatuses. In this case, the lighting modules 300a, 300b and 300c can illuminate a diffusing plate 400 of a lighting apparatus, and, as described above, the light emitting modules according to some implementations of the disclosed technology can illuminate the same area of the diffusing plate using a smaller number of light emitting diodes, or allow the light emitting diodes to be placed closer to the diffusing plate than the typical light emitting module.

Next, a method of fabricating a light emitting diode will be described to aid in understanding of the structure of a flip-chip type light emitting diode according to another embodiment of the disclosed technology.

Figure 20A:
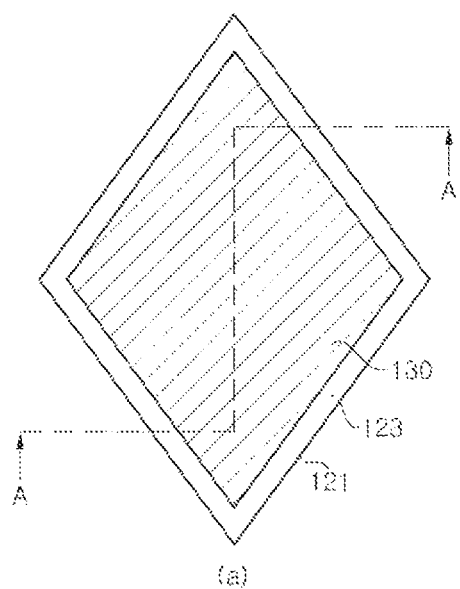
FIGS. 20(a) through 24(b) are views illustrating a method of fabricating a light emitting diode according to one embodiment of the disclosed technology.
Figure 20B:
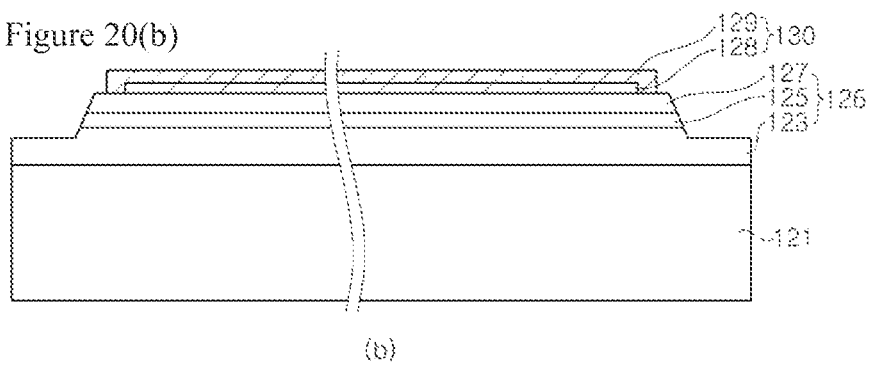

FIGS. 20(a) through (b) are views illustrating a method of fabricating a light emitting diode according to one embodiment of the disclosed technology. In each figure, (a) shows a plan view and (b) shows a sectional view taken along line A-A.

First, referring to FIGS. 20(a) and 20(b), a first conductive type semiconductor layer 123 is formed on a substrate 121, and an active layer 125 and a second conductive type semiconductor layer 127 are placed on the first conductive type semiconductor layer 123. The substrate 121 is or includes a substrate for growth of GaN-based semiconductor layers and may be or include, for example, a sapphire substrate, a silicon carbide substrate, or a gallium nitride substrate. In some implementations, the substrate 121 may be or include a sapphire substrate. Although the substrate 121 may be provided in the form of a large wafer capable of providing a plurality of light emitting diodes, FIGS. 20(a) and 20(b) show a portion of a substrate only for one of final light emitting diodes after being separated from the plurality of light emitting diodes. In the final light emitting diode, the substrate 121 may have a parallelogram shape having an acute angle, for example, a rhombus shape, without being limited thereto. Alternatively, the substrate may have any of a variety of polygonal shapes having an acute angle, such as a triangular shape, a pentagonal shape, and the like.

The first conductive type semiconductor layer 123 may be or include a nitride-based semiconductor layer doped with n-type impurities. In one embodiment, the first conductive type semiconductor layer 123 may be or include an $In_xAl_yGa_{1-x-y}N$ layer ($0 \leq x \leq 1$, $0 \leq y \leq 1$, $0 \leq x+y \leq 1$) doped with Si. For example, the first conductive type semiconductor layer 123 may be or include a Si-doped GaN layer. The second conductive type semiconductor layer 127 may be or include a nitride-based semiconductor layer doped with p-type impurities. In one embodiment, the second conductive type semiconductor layer 127 may be or include an $In_xAl_yGa_{1-x-y}N$ layer ($0 \leq x \leq 1$, $0 \leq y \leq 1$, $0 \leq x+y \leq 1$) doped with Mg or Zn. For example, the second conductive type semiconductor layer 127 may be or include a Mg-doped GaN layer. The active layer 125 may include a well layer including $In_xAl_yGa_{1-x-y}N$ ($0 \leq x \leq 1$, $0 \leq y \leq 1$, $0 \leq x+y \leq 1$) and may have a single quantum well structure or a multi-quantum well structure. In one embodiment, the active layer 125 may have a single quantum well structure including an InGaN, GaN or AlGaN layer, or a multi-quantum well structure including InGaN/GaN layers, GaN/AlGaN layers, or AlGaN/AlGaN layers.

The first conductive type semiconductor layer 123, the active layer 125 and the second conductive type semiconductor layer 127 may be formed by metal organic chemical vapor deposition (MOCVD) or molecular beam epitaxy (MBE).

A mesa M may be formed on the first conductive type semiconductor layer 123 and some region of the first conductive type semiconductor layer 123 is exposed along an edge of the mesa M. As shown in FIGS. 20(*a*) and 20(*b*), an upper surface of the first conductive type semiconductor layer 123 may be exposed along an edge of the substrate 121 of the final light emitting diode, and the active layer 125 and the second conductive type semiconductor layer 127 may be placed within an upper surface of the first conductive type semiconductor layer 123.

The mesa may be formed by growing a semiconductor stack structure 126 including the first conductive type semiconductor layer 123, the active layer 125 and the second conductive type semiconductor layer 127 on a first surface of the substrate 121 through metal organic chemical vapor deposition or the like, and patterning the second conductive type semiconductor layer 127 and the active layer 125 so as to expose the first conductive type semiconductor layer 123. The mesa M may be formed to have an inclined side surface using photoresist reflow technology. The inclined profile of the side surface of the mesa M improves extraction efficiency of light generated in the active layer 125. In addition, the mesa has a similar shape to the shape of the substrate 121 in a plan view. For example, the mesa has at least one acute angle like the substrate 121 in a plan view. The mesa may have a quadrangular shape including a pair of obtuse angles facing each other and a pair of acute angles facing each other in a plan view. The obtuse angles may have the same value and the acute angles may have the same value. Such a planar shape of the mesa may be a rhombus shape or a diamond shape.

One side surface of the mesa may be perpendicular to a flat zone of the substrate 121. In one embodiment, when the substrate 121 is or includes a sapphire substrate, one side surface of the mesa may be aligned on an m-plane. The planar shape of the semiconductor stack structure 126 may also be similar to that of the mesa.

On the other hand, a reflective electrode 130 is formed on the second conductive type semiconductor layer 127. The reflective electrode 130 may be formed on the mesa M after the mesa M is formed, without being limited thereto. Alternatively, the reflective electrode 30 may be formed on the second conductive type semiconductor layer 127 before formation of the mesa M after growing the second conductive type semiconductor layer 127. The reflective electrode 130 covers most regions of an upper surface of the second conductive type semiconductor layer and has substantially the same shape as the shape of the mesa M in a plan view.

The reflective electrode 130 includes a reflective layer 128 and may further include a barrier layer 129. The barrier layer 129 may cover an upper surface and a side surface of the reflective layer 128. For example, the barrier layer 129 may be formed to cover the upper surface and the side surface of the reflective layer 128 by forming a pattern of the reflective layer 128, followed by forming the barrier layer 129 thereon. For example, the reflective layer 128 may be formed by deposition and patterning of Ag, Ag alloy, Ni/Ag, NiZn/Ag, or TiO/Ag layers. On the other hand, the barrier layer 129 may be formed to include Ni, Cr, Ti, or Pt or combinations thereof and prevents diffusion or contamination of metallic materials in the reflective layer 128.

After forming the mesa M, an edge of the first conductive type semiconductor layer 123 may also be etched to expose the upper surface of the substrate 121. Here, the first conductive type semiconductor layer 123 may also be formed to have an inclined side surface.

Figure 21A:
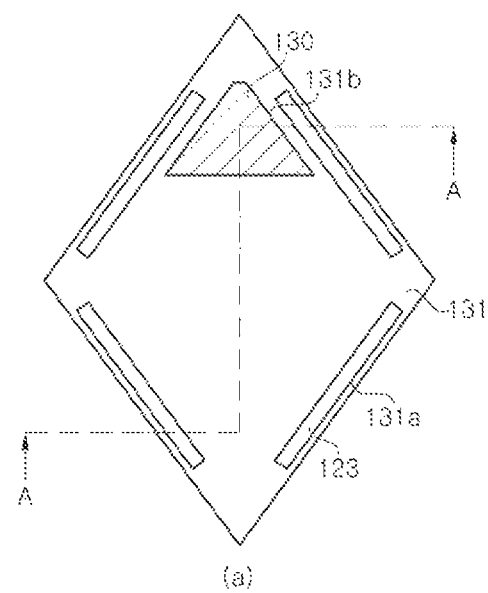
Figure 21B:
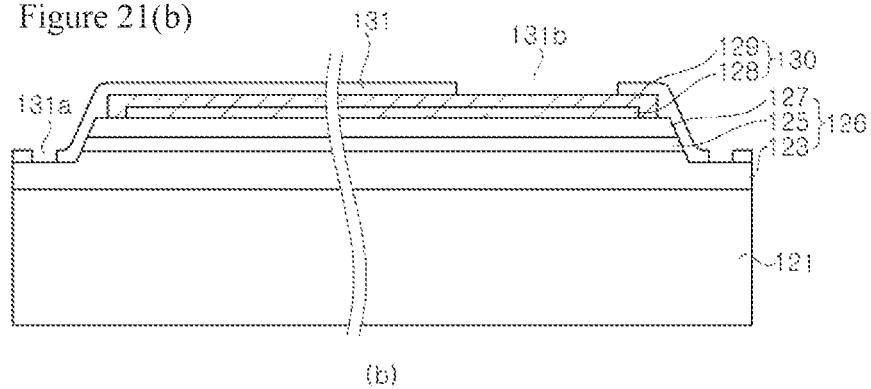

Referring to FIGS. 21(*a*) and 21(*b*), a lower insulation layer 131 is formed to cover the first conductive type semiconductor layer 123 and the reflective electrode 130. The lower insulation layer 131 includes or is placed to form openings 131*a* and 131*b* at some portions of the lower insulation layer 131 to allow electrical connection to the first conductive type semiconductor layer 123 and the reflective electrode 130 therethrough. For example, the lower insulation layer 131 may include or be placed to form openings 131*a* which expose the first conductive-type semiconductor layer 123 and an opening 131*b* which expose the reflective electrode 130.

The openings 131*a* may be placed near edges of the substrate 121 around the reflective electrode 130, and may have an elongated shape extending along the edges of the substrate 121. As shown in FIGS. 21(*a*) and 21(*b*), the openings 131*a* are farther separated from one another at acute angle portions than at obtuse angle portions. With this structure, it is possible to prevent current crowding near the acute angle portions. In one embodiment, a distance between the openings 131*a* near the acute angle portion may be greater than or equal to a current spreading length, and a distance between the openings near the obtuse angle portion may be less than or equal to the current spreading length. The current spreading length means a length from an edge of a p-electrode to a place at which current density is decreased to 1/e times upon application of drive current.

On the other hand, the opening 131*b* is placed in an upper region of the reflective electrode 130 and may be located towards the acute angle portion of the substrate 121. In one embodiment, the opening 131*b* may have a triangular shape or a trapezoidal shape.

The lower insulation layer 131 may be formed to include oxides such as $SiO_2$, nitrides such as SiNx, or insulation materials such as $MgF_2$ by chemical vapor deposition (CVD) or the like. The lower insulation layer 131 may be composed of a single layer or multiple layers. In addition, the lower insulation layer 131 may be formed as a distributed Bragg reflector (DBR) in which low refractive material layers and high refractive material layers are alternately stacked one above another. For example, an insulation reflective layer having high reflectivity may be formed by stacking, for example, $SiO_2/TiO_2$ layers or $SiO_2/Nb_2O_5$ layers.

Figure 25:
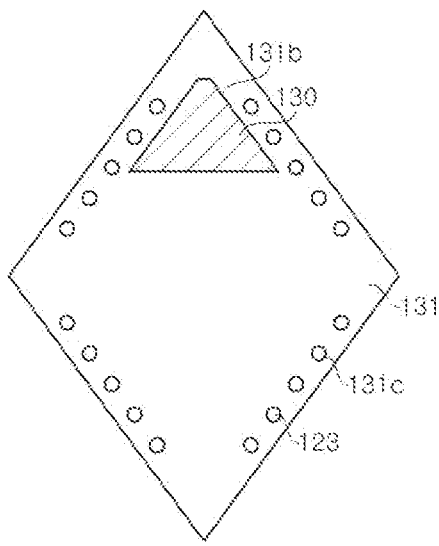
FIG. 25 shows an exemplary arrangement of a plurality of holes exposing the first conductive type semiconductor layer along the edges of the substrate.

In this embodiment, the openings 131*a* exposing the first conductive type semiconductor layer 123 have an elongated shape and are formed along the edges of the substrate 121. However, other implementations are also possible. For example, as shown in FIG. 25, a plurality of holes 131*c* exposing the first conductive type semiconductor layer 123 may be arranged along the edges of the substrate 121. In this case, the plurality of holes 131*c* may be arranged to be farther separated from one another around the acute angle portion than the obtuse angle portion, thereby relieving current crowding. In addition, a distance between the holes 131*c* at opposite sides of the acute angle portion may be greater than the distance between the holes 131*c* at opposite sides of the obtuse angle portion. In one embodiment, the distance between the holes 131*c* at the opposite sides of the acute angle portion may be greater than or equal to the current spreading length, and the distance between the holes 131*c* at the opposite sides of the obtuse angle portion may be less than or equal to the current spreading length. The holes 131*c* may have a polygonal shape, a circular shape, or a semi-circular shape.

Figure 22A:
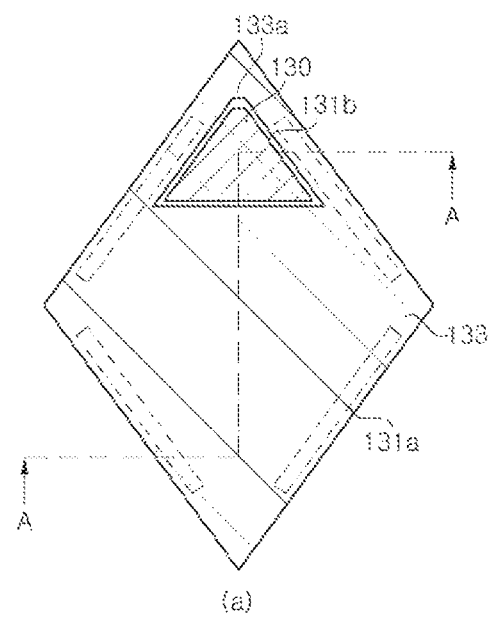
Figure 22B:
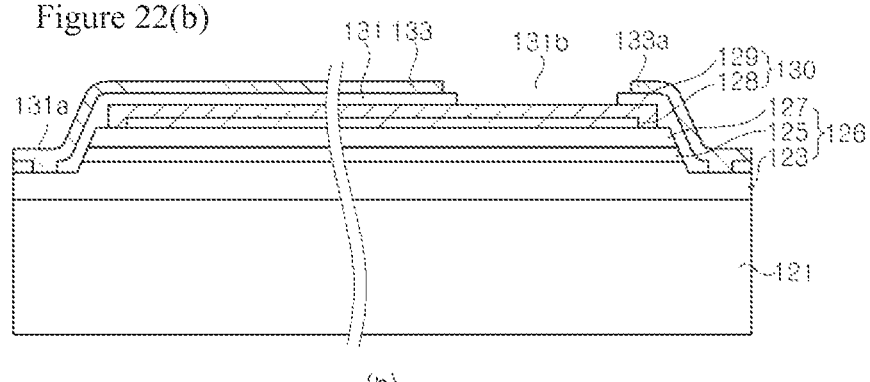

Referring to FIGS. 22(a) and 22(b), a current spreading layer 133 is formed on the lower insulation layer 131. The current spreading layer 133 covers the reflective electrode 130 and the first conductive type semiconductor layer 123. In addition, the current spreading layer 133 includes or is placed to form an opening 133a, which is placed in the upper region of the reflective electrode 130 and exposes the reflective electrodes 130. The current spreading layer 133 may form ohmic contacts with the first conductive-type semiconductor layer 123 through the openings 131a of the lower insulation layer 131. The current spreading layer 133 is insulated from the reflective electrode 130 by the lower insulation layer 131.

The opening 133a of the current spreading layer 133 has a greater area than the opening 131b of the lower insulation layer 131 to prevent the current spreading layer 133 from being connected to the reflective electrode 130. Thus, the opening 133a has sidewalls placed on the lower insulation layer 131.

The current spreading layer 133 is formed substantially over the entirety of the upper surface of the substrate 131 excluding the opening 133a. Accordingly, current can easily spread through the current spreading layer 133. The current spreading layer 133 may include a highly reflective metal layer such as an Al layer, and the highly reflective metal layer may be formed on a bonding layer such as a Ti, Cr or Ni layer. In addition, a protective layer having a single layer or composite layer structure including Ni, Cr, Au, and the like may be formed on the highly reflective metal layer. The current spreading layer 133 may have a multilayer structure including, for example, Ti/Al/Ti/Ni/Au.

Figure 23A:
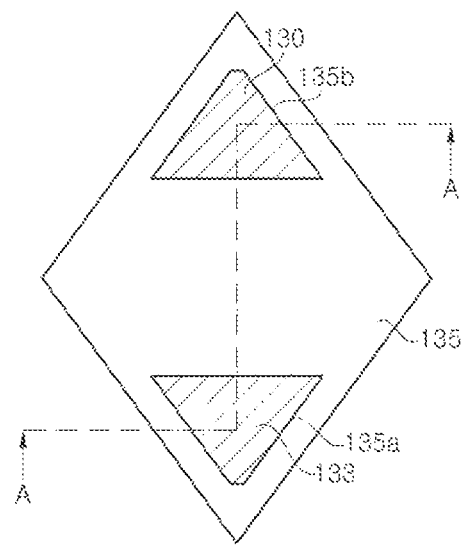
Figure 23B:
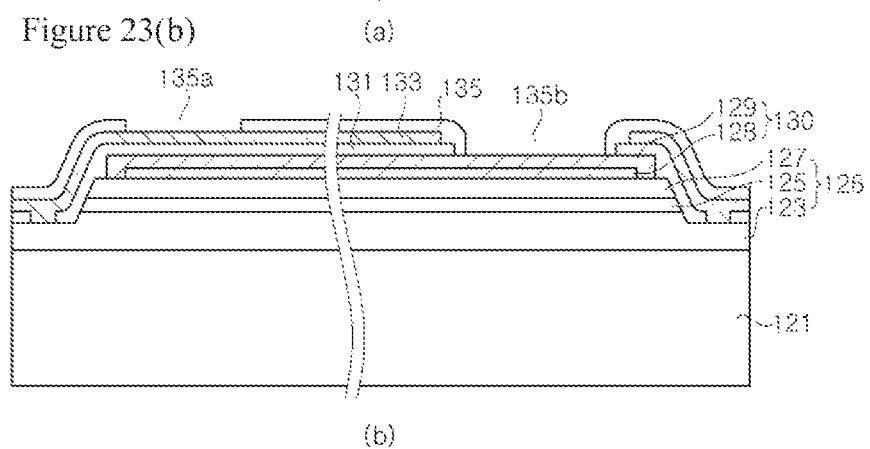

Referring to FIGS. 23(a) and 23(b), an upper insulation layer 135 is formed on the current spreading layer 133. The upper insulation layer 135 includes or is placed to form an opening 135a which exposes the current spreading layer 133, and an opening 135b which exposes the reflective electrode 130. The opening 135a and the opening 135b may be disposed to face each other, and may be disposed near the acute angle portions of the substrate 121, as shown in FIG. 23(a). In addition, the opening 135b exposes the reflective electrode 130, which is exposed through the opening 133a of the current spreading layer 133 and the opening 131b of the lower insulation layer 131. The opening 135b has a narrower area than the opening 133a of the current spreading layer 133. Accordingly, the sidewalls of the opening 133a of the current spreading layer 133 may be covered by the upper insulation layer 135. On the other hand, the opening 135b may have a smaller area than the opening 131b of the lower insulation layer 131. Alternatively, the opening 135b may have a greater area than the opening 131b of the lower insulation layer 131. The opening 135a may have a reversed trapezoidal shape and the opening 135b may have a trapezoidal shape.

The upper insulation layer 135 may be formed using an oxide insulation layer, a nitride insulation layer, or a polymer such as polyimide, Teflon, Parylene, or the like.

Figure 24A:
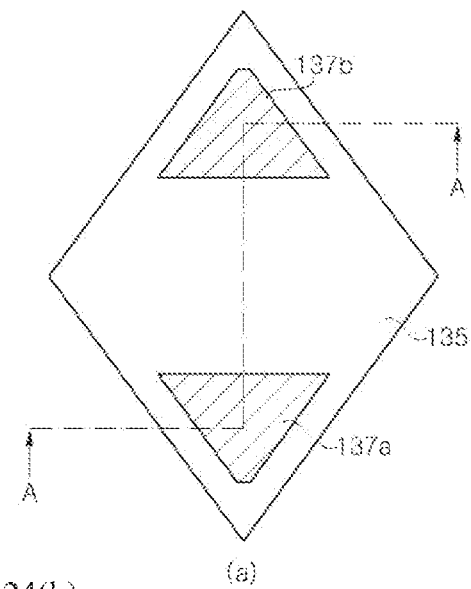
Figure 24B:
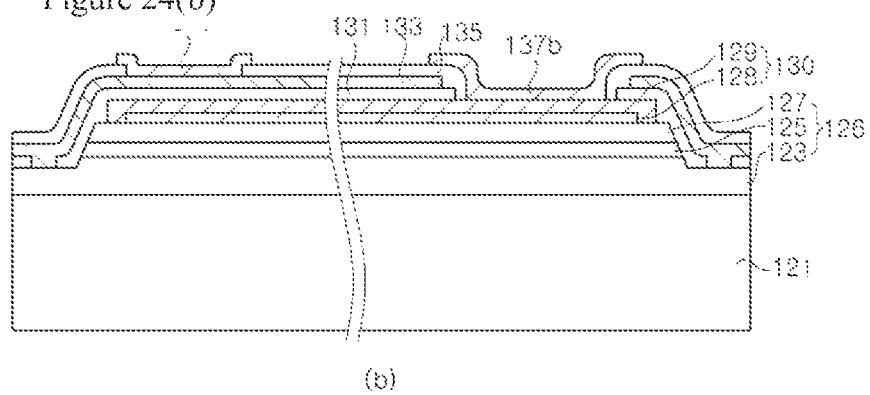

Referring to FIGS. 24(a) and 24(b), a first pad 137a and a second pad 137b are formed on the upper insulation layer 135. The first pad 137a is connected to the current spreading layer 133 through the opening 135a of the upper insulation layer 135, and the second pad 137b is connected to the reflective electrode 130 through the opening 135b of the upper insulation layer 135. As a result, the first pad 137a may be connected to the first conductive type semiconductor layer 123 through the current spreading layer 133 and the second pad 137b may be connected to the second conductive type semiconductor layer 127 through the reflective electrode 130. The first and second pads 137a and 137b may be used as pads for connecting bumps for mounting the light emitting diode on a sub-mount, a package, or a printed circuit board, or pads for surface mount technology (SMT).

The first and second pads 137a and 137b may be formed simultaneously by the same process, for example, a photolithography and etching process or a lift-off process. Each of the first and second pads 137a and 137b may include a bonding layer including, for example, Ti, Cr, Ni or the like, and a high conductivity metal layer including Al, Cu, Ag, Au or the like. In addition, each of the first and second pads 137a and 137b may further include a pad barrier layer covering the high conductivity metal layer. The pad barrier layer prevents diffusion of metallic elements such as tin (Sn) in the course of bonding or soldering, thereby preventing increase in specific resistance of the first and second pads 137a, 137b. The pad barrier layer may be formed of or include Cr, Ni, Ti, W, TiW, Mo, Pt or combinations thereof.

Then, the substrate 121 is divided into individual light emitting diode chips, thereby providing light emitting diode chips. For example, the substrate 121 may be divided into individual light emitting diode chips having a parallelogram shape by scribing along a group of m-planes. As a result, a light emitting diode including the substrate 121, side surfaces of which are composed of or include the group of m-planes, can be provided.

On the other hand, the substrate 121 may be subjected to a thinning process to have a thinner thickness before being divided into the individual light emitting diode chips. Here, the substrate 121 may have a thickness of greater than 100 μm, for example, 225 μm to 400 μm.

On the other hand, a conformal coating 50 (see FIG. 27) may be further formed to cover the substrate 121 of the individual light emitting diode chip. The conformal coating 150 may be formed before or after the division of the substrate 121 into individual chips.

Hereinafter, the structure of a light emitting diode 100a according to one embodiment of the disclosed technology will be described with reference to FIG. 26.

Figure 26:
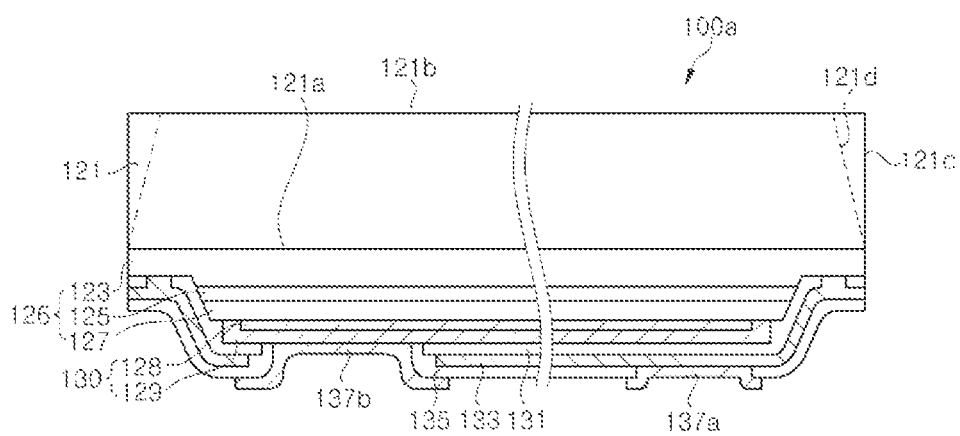
FIG. 26 shows an exemplary structure of a light emitting diode according to one embodiment of the disclosed technology.

Referring to FIG. 26, the light emitting diode 100a includes a substrate 121, a first conductive type semiconductor layer 123, an active layer 125, a second conductive type semiconductor layer 127, a first pad 137a, and a second pad 137b, and may include a reflective electrode 130, a current spreading layer 133, a lower insulation layer 131 and an upper insulation layer 135.

The substrate 121 may be or include a growth substrate for growth of gallium nitride-based epitaxial layers, for example, a sapphire substrate, a silicon carbide substrate, or a gallium nitride substrate. The substrate 121 may include a first surface 121a, a second surface 121b, and a side surface 121c. The first surface 121a is a plane on which semiconductor layers are grown, and the second surface 121b is a plane through which light generated in the active layer 125 is discharged to the outside. The side surface 121c connects the first surface 121a to the second surface 121b. The side surface 121c of the substrate 121 may be perpendicular to the first surface 121a and the second surface 121b, but is not limited thereto. Alternatively, the side surface 121b of the substrate 121 may be inclined. For example, as indicated by a dotted line in FIG. 26, the substrate 121 may have an inclined side surface 121d such that the first surface 121a has a greater area than the second surface 121b.

In addition, the substrate 121 may have a polygonal shape including at least one acute angle. For example, the first surface 121a and the second surface 121b may have a polygonal shape, such as a parallelogram shape, a triangular shape, a pentagonal shape, and the like, as shown in FIGS. 20(a) and 20(b). Since the substrate 121 includes an acute angle, the light emitting diode has improved light extraction efficiency through the acute angle portions while increasing the beam angle of light at the acute angle portions.

In this embodiment, the substrate 121 may have a thickness of greater than 100 μm, for example, in the range of 225 μm to 400 μm. The beam angle of light can increase with the increase of thickness of the substrate 121, and when the substrate 121 has a thickness of 225 μm or more, the beam angle of light can be generally maintained constant.

The first conductive type semiconductor layer 123 is placed on the first surface 121a of the substrate 121. The first conductive type semiconductor layer 123 may cover the overall surface of the first surface 121a of the substrate 121, without being limited thereto. Alternatively, the first conductive type semiconductor layer 123 may be placed within the substrate 121, for example, an upper region of the substrate, so as to allow the first surface 121a to be exposed along an edge of the substrate 121.

A mesa including the active layer 125 and the second conductive type semiconductor layer 127 is placed on the first conductive type semiconductor layer 123. For example, the active layer 125 and the second conductive type semiconductor layer 127 are placed within the first conductive type semiconductor layer 127, for example, the upper region of the first conductive type semiconductor layer 127, as described with reference to FIGS. 20(a) and 20(b). Accordingly, some region of the first conductive type semiconductor layer 127 may be exposed, for example, along the edge of the substrate 121.

The reflective electrode 130 forms ohmic contacts with the second conductive type semiconductor layer 127. As described with reference to FIGS. 20(a) and 20(b), the reflective electrodes 130 include a reflective layer 128 and a barrier layer 129, which may cover an upper surface and a side surface of the reflective layer 128.

The current spreading layer 133 covers the reflective electrode 130 and the first conductive type semiconductor layer 123. The current spreading layer 133 has or is placed to form an opening 133a placed in an upper region of the reflective electrode 130 such that the reflective electrode 130 is exposed through the opening. The current spreading layer 133 may cover the overall area of the reflective electrode 130 excluding a portion of the upper region of the reflective electrode 130 in which the opening 133a is formed, and may also cover the overall area of the first conductive type semiconductor layer 123.

The current spreading layer 133 also forms ohmic contacts with the first conductive type semiconductor layer 123 and is insulated from the reflective electrode 130. For example, the current spreading layer 133 may be insulated from the reflective electrode 130 by the lower insulation layer 131. The lower insulation layer 131 is placed between the reflective electrode 130 and the current spreading layer 133 to insulate the current spreading layer 133 from the reflective electrode 130.

In addition, the lower insulation layer 131 may have an opening 131b placed within the upper region of the reflective electrode 130 such that the reflective electrode 30 is exposed therethrough, and openings 131a that expose the first conductive type semiconductor layer 123 therethrough. The opening 131b of the lower insulation layer 131 has a smaller area than the opening 131a of the current spreading layer 133 and is completely exposed through the opening 133a.

On the other hand, the current spreading layer 133 may be connected to the first conductive type semiconductor layer 123 through the openings 131a. Here, as described with reference to FIGS. 21(a) and 21(b), the openings 131a may be placed along edges of the substrate 121 and may be farther separated from each other around an acute angle portion than around an obtuse angle portion. With this structure, the light emitting diode can prevent current crowding at the acute angle portion, thereby improving luminous efficacy. In addition, the lower insulation layer 131 may include holes 131c as described with reference to FIG. 25, instead of the openings 131a.

The upper insulation layer 135 covers at least a portion of the current spreading layer 133. In addition, the upper insulation layer 135 has or is placed to form an opening 135a that exposes the current spreading layer 133 and an opening 135b that exposes the reflective electrode 130. The opening 135a and the opening 135b may be placed near the acute angle portions to face each other. In addition, the upper insulation layer 135 may cover a sidewall of the opening 133a of the current spreading layer 133, and the opening 135b may be placed within the opening 133a.

The first pad 137a may be placed on the current spreading layer 133 and, for example, may be connected to the current spreading layer 133 through the opening 135a of the upper insulation layer 135. The first pad 137a is electrically connected to the first conductive type semiconductor layer 123 through the current spreading layer 133. In addition, the second pad 137b is connected to the reflective electrode 130 exposed through the opening 135b and electrically connected to the second conductive type semiconductor layer 127 through the reflective electrode 130.

According to this embodiment, the substrate 121 has a polygonal shape including at least one acute angle, such as a parallelogram shape or a triangular shape, thereby improving light extraction efficiency. Furthermore, luminous flux through the acute angle portions is increased, whereby the beam angle of the light emitting diode can be adjusted using the acute angle portions.

In addition, according to this embodiment, the substrate 121 has a thickness of 100 μm or more, thereby improving the beam angle of light.

Further, the current spreading layer 123 includes a reflective metal layer such as an Al layer or the lower insulation layer is formed as an insulation reflective layer, whereby light not reflected by the reflective electrodes 130 can be reflected by the current spreading layer 123 or the lower insulation layer 131, thereby improving light extraction efficiency.

Figure 27:
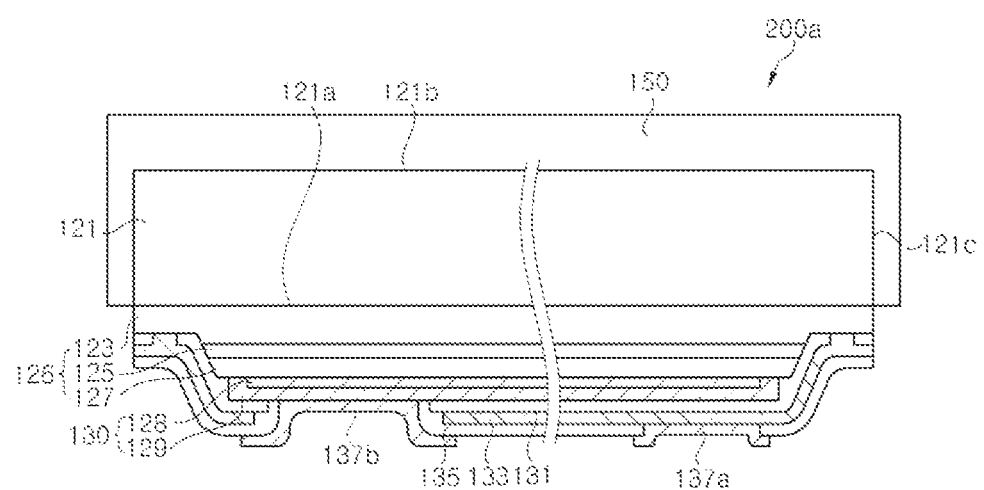
FIG. 27 shows an exemplary conformal coating.

FIG. 27 is a sectional view of a light emitting diode 200a according to yet another embodiment of the disclosed technology.

The light emitting diode 200a according to this embodiment is generally similar to the light emitting diode 100a of FIG. 26 except for a conformal coating 150 placed on the substrate 121. The conformal coating 150 evenly covers the second surface 121b of the substrate 121 and may also cover the side surface 121c. The conformal coating 150 may contain a wavelength conversion material such as phosphors.

Further, the sum of the thickness of the substrate 121 and the thickness of the conformal coating 150 may be 225 μm to 600 μm. For example, the conformal coating 150 may have a thickness of 20 μm to 200 μm. Further, the thickness of the substrate 121 may vary depending upon the thickness of the conformal coating, for example, may range from 100 μm to 400 μm. When the sum of the thickness of the substrate 121 and the thickness of the conformal coating 150 is greater than or equal to 225 µm, the beam angle of the light emitting diode 200a can be increased to 140° or more.

Figure 28A:
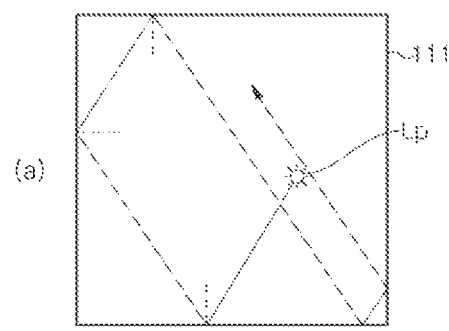
FIGS. 28(a) to 28(b) show schematic plan views illustrating light extraction characteristics depending on the shape of a substrate.
Figure 28B:
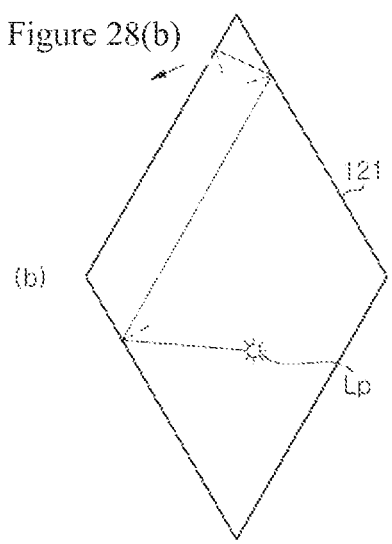

FIGS. 28(a) and 28(b) show schematic plan views illustrating light extraction characteristics depending on the shape of a substrate. Here, (a) shows a travelling passage of light in a typical substrate 111 having a rectangular shape, and (b) shows a traveling passage of light in a substrate 121 having a diamond shape including acute angles according to one embodiment of the disclosed technology.

Referring to FIG. 28(a), some of light generated at a specific place Lp in an active layer enters the substrate 111 and repeats total reflection on inner side surfaces of the substrate 111. As a result, the light travels a substantial distance within the substrate 111, thereby causing light loss within the substrate 111. As the thickness of the substrate 111 increases, total reflection of light becomes more severe on the side surfaces of the substrate 111, thereby increasing light loss. Furthermore, since light emitted from portions of the substrate 111 has similar characteristics, there is no substantial difference in beam angle according to directions.

On the contrary, in the substrate 121 having a diamond shape as shown in FIG. 28(b), some of light generated at a specific place Lp in an active layer enters the substrate 121, is totally reflected by inner side surfaces of the substrate 121, and then discharged outside with a reduced incidence angle of light near an acute angle portion. Accordingly, as compared with the typical substrate 111, the substrate 121 having a diamond shape provides improved light extraction efficiency. Furthermore, since light extraction efficiency is increased at the acute angle portion, the beam angle of light increases at the acute angle portion as compared with the obtuse angle portion. Accordingly, it is possible to provide a light emitting diode having different beam angles depending on directions.

Figure 29:
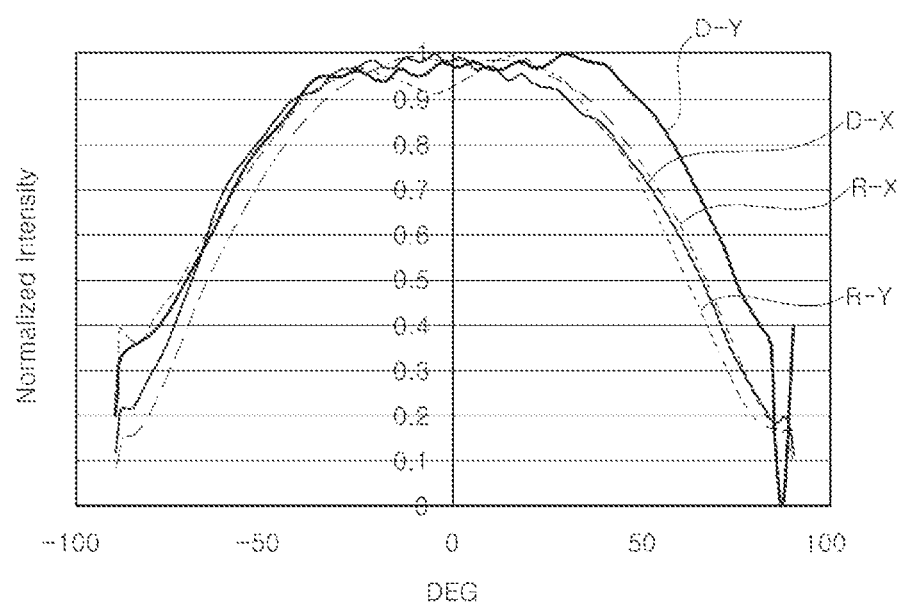
FIG. 29 is graph depicting beam angles of a flip-chip type light emitting diode fabricated by a typical method and a flip-chip type light emitting diode fabricated by a method according to one embodiment of the disclosed technology.

FIG. 29 is graph depicting beam angles of a flip-chip type light emitting diode fabricated by a typical method and a flip-chip type light emitting diode fabricated by a method according to one embodiment of the disclosed technology. In the light emitting diode fabricated by the typical method, a substrate 111 had a rectangular shape of 300 µm×1000 µm and a thickness of about 250 µm. In the flip-chip type light emitting diode fabricated by the method according to the embodiment, a distance between acute angle portions of a substrate 121 was 1 mm and a distance between obtuse angle portions thereof was about 0.58 mm.

Referring to FIG. 29, for the typical light emitting diode, a beam angle distribution (R-X) in the x-axis (minor axis) direction is generally similar to a beam angle distribution (R-Y) in the y-axis (major axis) direction. On the contrary, for the light emitting diode according to the embodiment of the disclosed technology, a beam angle distribution (D-Y) in the x-axis direction passing the acute angle portions is greater than a beam angle distribution (D-X) in the y-axis direction passing the obtuse angle portions.

Thus, according to the embodiments of the disclosed technology, it is possible to provide a light emitting diode exhibiting different beam angle characteristics according to the x-axis direction and the y-axis direction. Such a light emitting diode may be advantageously used in a lighting apparatus, which requires different beam angle characteristics depending on direction, such as an LED fluorescent lamp. For example, a plurality of light emitting diodes may be linearly arranged to be perpendicular to the longitudinal direction of the LED fluorescent lamp having a wide beam angle, thereby enabling illumination of a wide area while reducing light loss within the fluorescent lamp.

Only a few embodiments, implementations and examples are described and other embodiments and implementations, and various enhancements and variations can be made based on what is described and illustrated in this document.

What is claimed is:

1. A lighting module including a plurality of light emitting diodes, at least one of the light emitting diodes comprising:
    a transparent substrate having a first surface, a second surface and a side surface connecting the first surface and the second surface;
    a first conductive type semiconductor layer placed on the first surface of the transparent substrate;
    a second conductive type semiconductor layer placed on the first conductive type semiconductor layer;
    an active layer placed between the first conductive type semiconductor layer and the second conductive type semiconductor layer;
    a first pad electrically connected to the first conductive type semiconductor layer;
    a second pad electrically connected to the second conductive type semiconductor layer, and
    a current spreading layer contacting an edge of the first conductive type semiconductor layer and formed on a portion of an area above the second conductive type semiconductor layer;
    wherein light generated in the active layer is discharged through the transparent substrate via the second surface of the transparent substrate, and the at least one light emitting diode has a beam angle of 140° or more in at least one axial direction thereof, and
    wherein the at least one light emitting diode further comprises a conformal coating layer covering the second surface of the transparent substrate, and a total thickness of the transparent substrate and the conformal coating ranges from 225 µm to 600 µm.

2. The lighting module according to claim 1, wherein the transparent substrate has a thickness of 225 µm to 400 µm.

3. The lighting module according to claim 1, wherein the active layer and the second conductive type semiconductor layer are patterned to form a plurality of mesas over the first conductive type semiconductor layer, the plurality of mesas being separated from one another.

4. The lighting module according to claim 3, wherein the at least one of the light emitting diodes further comprises:
    reflective electrodes placed over the plurality of mesas and forming ohmic contact with the second conductive type semiconductor layer; and
    a current spreading layer placed over the plurality of mesas and the first conductive type semiconductor layer to form respective openings in upper regions of the plurality of mesas and exposing the reflective electrodes, the current spreading layer forming ohmic contacts with the first conductive type semiconductor layer and being insulated from the plurality of mesas,
    wherein the first pad is electrically connected to the current spreading layer and the second pad is electrically connected to the reflective electrodes through the openings.

5. The lighting module according to claim 3, wherein the at least one of the light emitting diodes further comprises a lower insulation layer covering at least a portion of the plurality of mesas and at least a portion of the first conductive type semiconductor layer.

6. The lighting module according to claim 3, wherein at least one of the plurality of mesas are placed to extend to an edge of the first conductive type semiconductor layer.

7. The lighting module according to claim 1, wherein the conformal coating layer has a thickness of 20 μm to 200 μm.

8. A lighting apparatus comprising:
a lighting module that includes at least one light emitting diode, wherein the at least one light emitting diode includes:
a first conductive type semiconductor layer placed on the first surface of the transparent substrate;
a second conductive type semiconductor layer placed on the first conductive type semiconductor layer;
an active layer placed between the first conductive type semiconductor layer and the second conductive type semiconductor layer;
a first pad electrically connected to the first conductive type semiconductor layer;
a second pad electrically connected to the second conductive type semiconductor layer,
a current spreading layer contacting an edge of the first conductive type semiconductor layer and formed on a portion of the second conductive type semiconductor layer;
wherein light generated in the active layer is discharged through the transparent substrate via the second surface of the transparent substrate, and the at least one light emitting diode has a beam angle of 140° or more in at least one axial direction thereof, and
wherein the at least one light emitting diode further comprises a conformal coating layer covering the second surface of the transparent substrate, and a total thickness of the transparent substrate and the conformal coating ranges from 225 μm to 600 μm.

9. The lighting apparatus according to claim 8, wherein the transparent substrate has a thickness of 225 μm to 400 μm.

10. The lighting apparatus according to claim 8, wherein the active layer and the second conductive type semiconductor layer are patterned to form a plurality of separate mesas over the first conductive type semiconductor layer.

11. The lighting apparatus according to claim 10, wherein at least one of the plurality of separate mesas extend to an edge of the first conductive type semiconductor layer.

12. A backlight unit comprising a plurality of light emitting diodes, at least one of the light emitting diodes comprising:
a transparent substrate having a first surface and a second surface;
a first conductive type semiconductor layer placed over the first surface of the transparent substrate;
a second conductive type semiconductor layer placed over the first conductive type semiconductor layer;
an active layer placed between the first conductive type semiconductor layer and the second conductive type semiconductor layer;
a first pad electrically connected to the first conductive type semiconductor layer;
a second pad electrically connected to the second conductive type semiconductor layer,
a current spreading layer contacting an edge of the first conductive type semiconductor layer and formed on a portion of the second conductive type semiconductor layer;
wherein the transparent substrate is placed to enable light generated in the active layer to discharge through the transparent substrate via the second surface of the transparent substrate, and the at least one light emitting diode has a beam angle of 140° or more, and
wherein the at least one of the light emitting diodes comprises a conformal coating layer covering the second surface of the transparent substrate, and a total thickness of the transparent substrate and the conformal coating ranges from 225 μm to 600 μm.

13. The backlight unit according to claim 12, wherein the transparent substrate has a thickness of 225 μm to 400 μm.

14. The backlight unit according to claim 12, wherein the conformal coating has a thickness of 20 μm to 200 μm.

15. The backlight unit according to claim 12, wherein the active layer and the second conductive type semiconductor layer are patterned to form a plurality of mesas over the first conductive type semiconductor layer, the plurality of mesas being separated from one another.

16. The backlight unit according to claim 15, wherein the at least one light emitting diode further comprises:
reflective electrodes placed over the plurality of mesas and forming ohmic contacts with the second conductive type semiconductor layer; and
a current spreading layer covering the plurality of mesas and the first conductive type semiconductor layer and placed to form respective openings in upper regions of the plurality of mesas while exposing the reflective electrodes, the current spreading layer forming ohmic contacts with the first conductive type semiconductor layer and being insulated from the plurality of mesas,
wherein the first pad is electrically connected to the current spreading layer and the second pad is electrically connected to the reflective electrodes through the openings.

17. The backlight unit of claim 15, wherein the at least one light emitting diode further comprises a lower insulation layer covering at least a portion of the plurality of mesas and at least a portion of the first conductive type semiconductor layer.

18. The backlight unit of claim 15, wherein at least one of the plurality of mesas extends to an edge of the first conductive type semiconductor layer.

19. The backlight unit of claim 15, wherein the plurality of mesas have an elongated shape extending in one direction.

20. The backlight unit of claim 19, wherein the plurality of mesas are disposed parallel to one another.

* * * * *